(12) United States Patent
Sasaki et al.

(10) Patent No.: US 6,804,068 B2
(45) Date of Patent: Oct. 12, 2004

(54) OPTICAL UNIT

(75) Inventors: Yasuo Sasaki, Tokyo (JP); Tomoaki Sato, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 10/348,702

(22) Filed: Jan. 21, 2003

(65) Prior Publication Data

US 2003/0165022 A1 Sep. 4, 2003

(30) Foreign Application Priority Data

Jan. 21, 2002 (JP) ........................................ 2002-011902

(51) Int. Cl.$^7$ ................................................ G02B 7/02
(52) U.S. Cl. ...................................... 359/811; 359/824
(58) Field of Search ................................ 359/694, 696, 359/811, 819, 809, 820, 821–824; 369/44.14, 44.15; 396/526; 362/455; 353/100

(56) References Cited

U.S. PATENT DOCUMENTS 6,067,421 A * 5/2000 Kitazawa et al. ............ 396/133
6,134,057 A * 10/2000 Ueyama et al. .............. 359/821

FOREIGN PATENT DOCUMENTS

JP          2001075162          3/2001

OTHER PUBLICATIONS

"2000 Micro–Machine Technique Research and Development (Power Generation Equipment High Performance Maintenance Technique Development) Commission Research Result Reports".

* cited by examiner

Primary Examiner—Hung Xuan Dang
Assistant Examiner—Joseph Martinez
(74) Attorney, Agent, or Firm—Volpe and Koenig, P.C.

(57) ABSTRACT

Each Lens support member 22, 23, holds a lens capable of being driven for displacement in unison with the lens for desired optical adjustment. A guide bar 26 restricts the lens support member such that the displaceable direction thereof is along a predetermined direction. An actuator element includes a curved plate-like electrostriction element of a polymer material layer laminate disposed curvedly along and in a state of being wound on part of an outer periphery of the guide bar for generating a drive displacement such as to be expanded or compressed in the longitudinal direction of the guide bar when a drive voltage is applied across the element, the drive displacement being capable of being transferred to the lens support member.

25 Claims, 10 Drawing Sheets

OPTICAL UNIT

CROSS REFERENCE TO RELATED APPLICATION

This application claims benefit of Japanese Patent Application No. 2002-011902 filed on Jan. 21, 2002, the contents of which are incorporated by the reference.

BACKGROUND OF THE INVENTION

The present invention relates to optical units and, more particularly, to optical units utilized for cameras and the like.

Heretofore, so-called electronic cameras such as film cameras, electronic still cameras and video cameras have been put to practical use and widely spread, which are constructed such that, a foreground object image formed on the basis of a light flux of a foreground object (hereinafter referred to as foreground object flux) which is incident on an imaging optical system having a plurality of optical elements (or lens groups) and other elements, is focused on the light-receiving surface of a foreground object image obtaining means, such as a photographic imaging film or a charge coupled device (abbreviated CCD), disposed at a predetermined position, thereby obtaining a desired foreground object image and recording the same image in a predetermined form.

Such prior art film cameras and electronic cameras (both types of cameras being hereinafter generally referred to as cameras), are usually constructed to have an optical unit having an imaging optical system or an optical element (constituted by a plurality of lenses (hereinafter referred to as lens unit) for focusing the foreground object image on a predetermined position.

Usually, such a camera is brought outdoors by the user for use. Thus, importance has hitherto been attached to the portability of the cameras, and more and more thickness and size reduction of the camera itself has been demanded.

In recent years, electronic cameras which are constructed with a main aim of obtaining electronic still image data are being rapidly spread. Such electronic cameras usually comprise various constituent parts such as a circuit substrate, which is a member constituting part of a lens unit, and on which are mounted, for such purposes as zooming operation and focus adjusting operation, drive mechanism and actuators for causing movement of an optical element constituting an imaging optical system (hereinafter referred to as lens group) in predetermined directions as well as electric circuit for controlling these drive mechanisms and actuators.

This means that size reduction of the camera itself calls for adequately disposing constituent parts of the camera in the inside thereof while also taking the size reduction of the individual constituent parts into considerations.

As for lens units in prior art cameras, those of various forms are well known in the art, for instance one, in which in order to lead a foreground object light flux incident in the camera inside via a plurality of lens groups to a light-receiving surface of an imaging element or the like, a predetermined reflecting means such as a reflector or a prism is disposed in the optical path to let the optical path of the foreground object light flux be bent in a predetermined direction, for instance a direction substantially perpendicular to the incident light flux axis.

As the lens unit adopting so-called bending optical system as above, various proposals are made in various literatures such as Japanese Patent Laid-Open No. 2001-75162.

In the lens unit disclosed in the above Japanese Patent Laid-Open No. 2001-75162, a reflecting means for bending the optical axis of the foreground object light flux to a substantially perpendicular direction is disposed in the optical path of an imaging optical system, which transmits the foreground object light flux, thereby realizing size reduction of the electronic camera itself while securing an optical path length necessary for obtaining the image.

As shown, adopting the so-called bending optical system with a reflecting means or the like disposed in the optical path in the imaging optical system of electronic camera, can be thought to be very advantageous means for realizing the size reduction of the electronic camera itself.

In the meantime, in prior art cameras, wide use is made of small size stepping motors and DC motors (hereinafter merely referred to as small size motors) as actuators for individually driving respective lenses, which contribute to the zooming and focus adjusting operations, among the plurality of lenses constituting the imaging optical system.

However, when a usual actuator such as a small size motor is utilized for driving the lenses contributing to the zooming and focus adjusting operations, a problem is posed that a drive power transmitting mechanism for transmitting rotational drive power to the small motor is complicated.

Specifically, for carrying out the zooming and focus adjusting operations, predetermined lens groups have to be moved straight in directions among the optical axis of the imaging optical system. This means the need for a drive power transmitting mechanism for transmitting drive power from the small size motor as drive source to the zooming and focus adjusting lenses as driven members and also a drive power converting mechanism for converting the driving direction of the drive power.

The drive power transmitting and like mechanisms are usually constituted by gears. These gears or like constituent parts should be mechanically accurately manufactured to ensure reliable and loss-free drive power transmission to the driven members.

However, the camera which size reduction is demanded for, has a problem that accurate and inexpensive mass production is subject to difficulties. This means that for constructing a smaller size drive power transmitting mechanism, higher precision machining techniques are necessary, leading to the tendency of manufacturing cost increase.

Also, with the drive power transmitting or like mechanisms that are constructed with gears or the like, drive power is mechanically transmitted. Therefore, the drive power transmission is inevitably subject to drive power losses. Also, drive noise can not be perfectly suppressed.

Furthermore, in the usual camera, secondary batteries of low power capacity such as dry cells and lithium cells are usually used as the drive power supply. Saving of consumed power, is thus required for the electric constituent parts provided in the camera.

However, small size motors usually used as drive power supply of prior art cameras have a problem that high drive power is required. For example, small size motors usually used in cameras require power of 3 V/300 mA (i.e., roughly 1 W).

In prior art cameras, the control system of the camera is usually contrived such as to reduce the drive time of the small size motor for preventing wasteful power consumption. As an example, it is contrived to control the focus adjusting operation (i.e., AF operation) to be executed when and only when required at the time of imaging and also to control the focus adjusting and zooming operations such as not to be executed at the same time. Such controls tend to prolong the operation time as required for a series of imaging operations. This tendency leads to a problem of prolonging the time lag between the time when the shutter release button of the camera is actually operated by the user and the time when the shutter is actually driven for the exposure operation.

As shown above, in the case of utilizing the prior art small size motor or the like as the drive power supply (or actuator) in the camera, limitations are imposed on the size reduction and power saving of the camera.

In recent years, as the drive power source (or actuator) to be used in super-small size precision machines or the like, various types of actuator which are in different drive systems from the small size motor noted above are being developed.

For example, electrostriction actuators are described in "2000 Micro-Machine Technique Research and Development (Power Generation Equipment High Performance Maintenance Technique Development) Commission Research Result Reports", Foundation Micro-Machine Center, March, 2001.

FIG. 17 is a view schematically showing the construction of the electrostriction actuator described in the above literature.

As shown in FIG. 17, this electrostriction actuator 100 comprises a polymer thin film 101 and electrode layers 102 and 103 of a conductive material formed to be integral with the opposite surfaces of the polymer thin film 101.

The polymer thin layer 101 is a member of a soft material group capable of being readily deformed when experiencing external forces, such as silicone elastomer, acrylic elastomer and polyurethane.

The elastomer is the abbreviation of elastic polymer and refers to pronouncedly elastic polymers, i.e., polymer materials exhibiting rubber-like elasticity in the neighborhood of normal temperature or elastic materials having elongation rates of 100% and above. These materials have such a character that they are readily deformed by external forces but are restored to the initial form as soon as the external forces are removed.

The electrode layers 102 and 103 are made of carbon-containing grease or like materials, and when they are formed to be integral with the polymer thin layer 101, they can be deformed in the same direction as the direction of deformation of the polymer thin film 101.

In the electrostriction actuator 100 having the above structure, by applying a positive (or plus) voltage to the electrode layer 102 while applying a negative (or minus) voltage to the other electrode layer 103, the two electrode layers 102 and 103 exert pulling forces to each other (in the directions of arrows as shown in FIG. 17). As a result, the polymer thin layer 101 is deformed such as to be squeezed.

In this case, the polymer thin layer 101 itself, which is made of a soft material as noted above, is elongated in the directions of arrows Y in FIG. 17, i.e., the directions of its plane (i.e., horizontal direction).

When power supply to the two electrode layers 102 and 103 is turned off, the forces exerted to the polymer thin layer 101 in the directions of arrows X are removed, and the polymer thin layer 101 is thus restored to the initial form. Such characteristics are referred to as electrostriction effect, and the electrostriction actuator utilizes this electrostriction effect to generate drive power.

FIG. 18 is a graph showing the relation between the distortion caused by voltage application to the electrostriction actuator and the applied voltage. As shown in FIG. 18, the distortion ($\Delta L/L0$ (%)) has such a character that the actuator undergoes non-linear displacement in correspondence to given voltage E (V) and is restored to the initial form without generation of any hysteresis. Here, $\Delta L$ represents the elongation of the electrostriction actuator, and Lo is the length dimension of the actuator in the directions of deformation (or elongation) without presence of any applied voltage.

The electrostriction actuator 100 as described, which generates drive power by deforming itself, does not require any complicated drive power transmitting mechanism, and can provide desired drive power with a very small size and simple structure compared to the prior art small size motor or like actuator. Besides, without need of any drive power transmitting mechanism such as gears, the electrostriction actuator can realize power saving and noise reduction.

SUMMARY OF THE INVENTION

The present invention was made in view of the above points, and its object is to provide an optical unit, which uses, in view of small size motors or actuators usually utilized in prior art cameras or the like, electrostriction actuators utilizing the electrostriction effect, thus simplifying drive power transmitting and like mechanisms and permitting contribution to its size reduction ad power saving.

Aspects of the present invention are summarized in the following with reference to member or component attached with numerals in the drawings. These concrete indications merely refer to clarify the example of structure and does not limit any scope of the present invention.

According to an aspect of the present invention, there is provided an optical unit comprising: a plurality of lens support members (lens frames 23 and 24) each holding a lens capable of being driven for displacement in unison with the lens for desired optical adjustment; a guide bar (main guide bar 26) for restricting the lens support members such that the displaceable direction thereof is along a predetermined direction; and a plurality of actuator elements (refers to FIGS. 5 to 7) each including a curved plate-like electrostriction element (actuators 33 and 36) of a polymer material layer laminate disposed curvedly along and in a state of being wound on part of the outer periphery of the guide bar for generating a drive displacement such as to be expansion or compressed in the longitudinal direction of the guide bar in response to a drive voltage applied across itself (voltage control or application and removal of the voltage), the drive displacement being capable of being transferred to the lens support member.

Each electrostriction element in each actuator element is a substantially hollow cylindrical member in form and has a release part formed on part of the own outer periphery along the axial direction.

Each actuator element further includes a biasing element (note: spring element in the additional figure (FIG. 7(b)) for providing a pre-strain (preliminarily given strain) to the curved plate-like element to cause strain thereof in curved circumferential direction.

The biasing element is an elastic member (i.e., spring element in FIG. 7(b)) for providing a stress in the curved plate-like electrostriction element in a direction of causing expansion of the electrostriction element by generating a biasing force in a direction to cause compression of itself at all times.

The electrostriction element of the actuator element is substantially cylindrical in form and has a release part formed on part of the outer periphery of itself and extending in the axial direction, the release part further including a biasing element for providing a pre-strain for causing expansion of the electrostriction element in the curved circumferential direction.

The elastic member is a curved plate-like spring, which is saw-wave like in form and extends in the axial direction perpendicular to the direction of action to the own bias force.

The actuator element includes a cover member (38 in FIGS. 5 to 7) provided on the side of the outer periphery of the curved plate-like electrostriction element.

The actuator element includes a cover member (cover member in FIG. 7(b)) provided on the side of the outer periphery of the biasing element.

The curved plate-like electrostriction element has one axial end in contact with a stationary part at all times, and when it undergoes strain or expansion displacement as a result of application of a drive voltage across it, its other end is brought into contact with the corresponding lens support member to push and cause displacement of the lens support member.

The actuator element is constituted by a plurality of actuators each provided for a corresponding one of lens support members.

Other objects and features will be clarified from the following description with reference to attached drawings.

PREFERRED EMBODIMENTS OF THE INVENTION

Preferred embodiments of the present invention will now be described with reference to the drawings.

The optical unit according to the present invention is applicable to so-called film cameras, which use photographic imaging films for photographing imaging, and also to such electronic cameras as electronic still cameras and video cameras, which use such an imaging element as charge-coupled device (CCD) for obtaining electronic still or motion picture images and recording such images in such form as digital data in a recording medium. The following description mainly concerns, as example, the case of applying the optical unit according to the present invention to electronic still cameras capable of obtaining and recording still images (hereinafter referred to electronic cameras).

Figure 1:
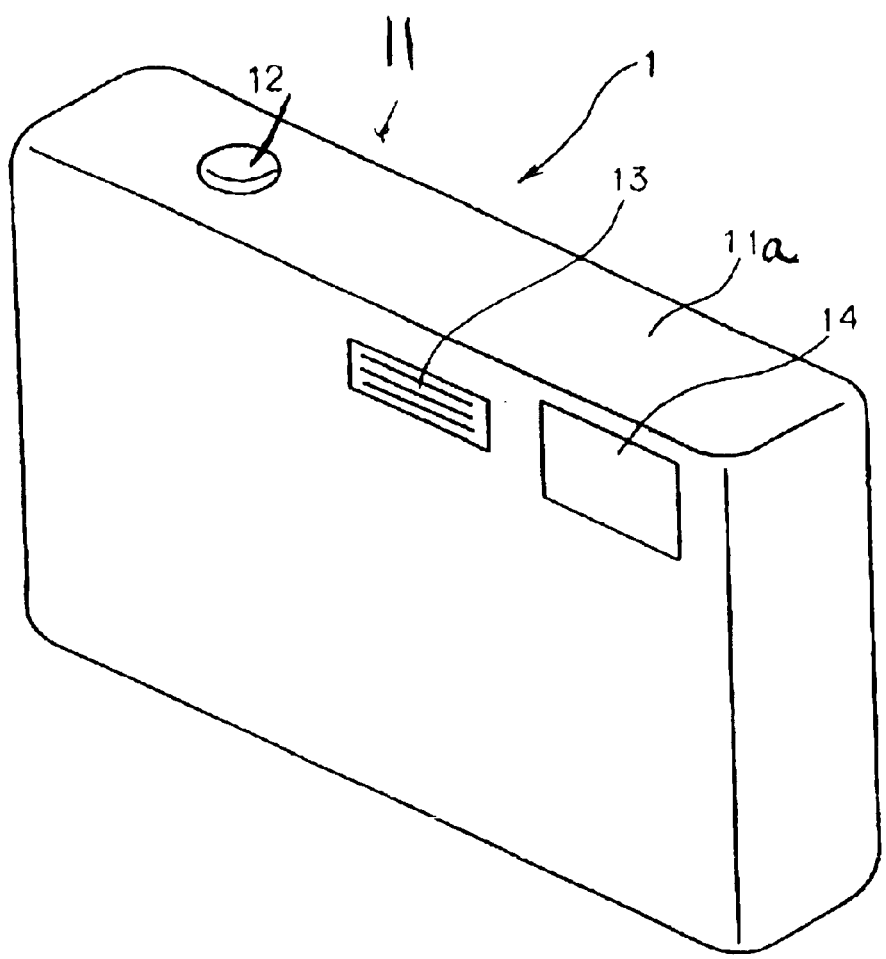
FIG. 1 is a perspective view showing an electronic camera adopting the embodiment of the optical unit.
Figure 2:
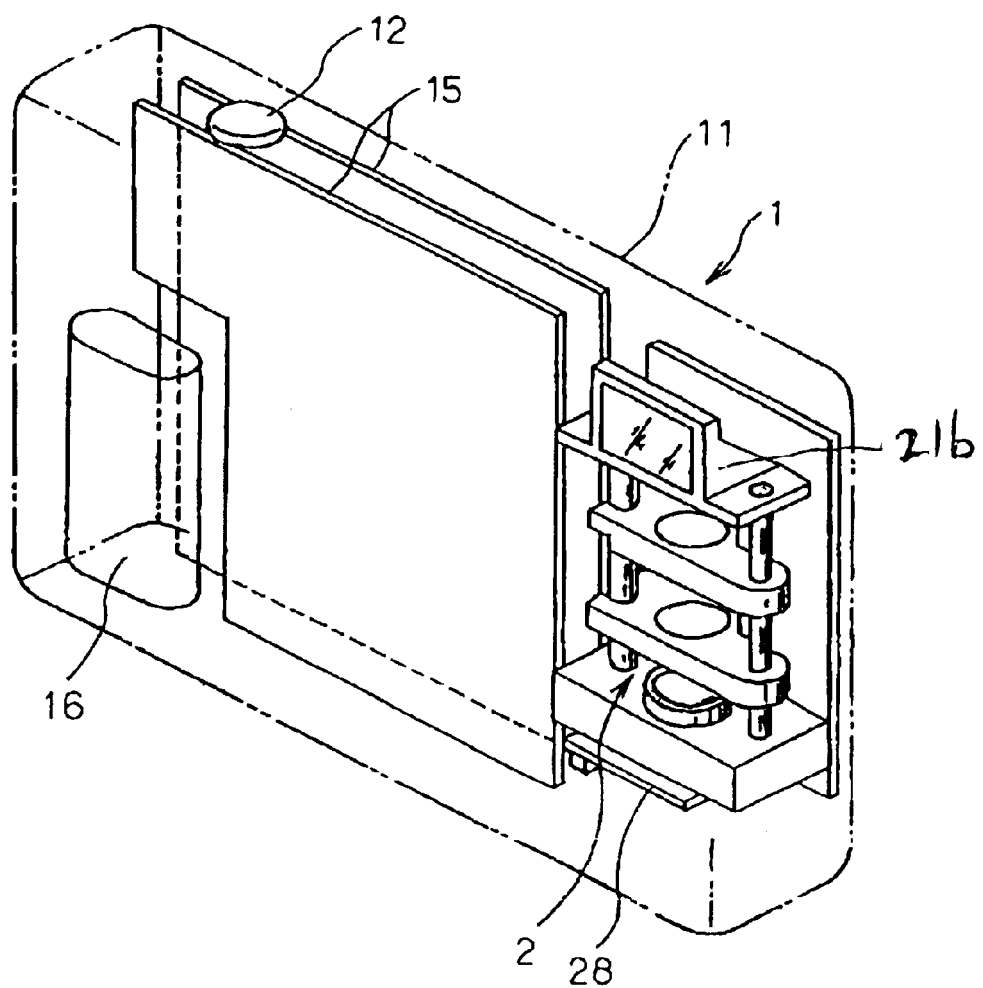
FIG. 2 is a schematic perspective view showing main internal constituent parts of the electronic camera.
Figure 3:
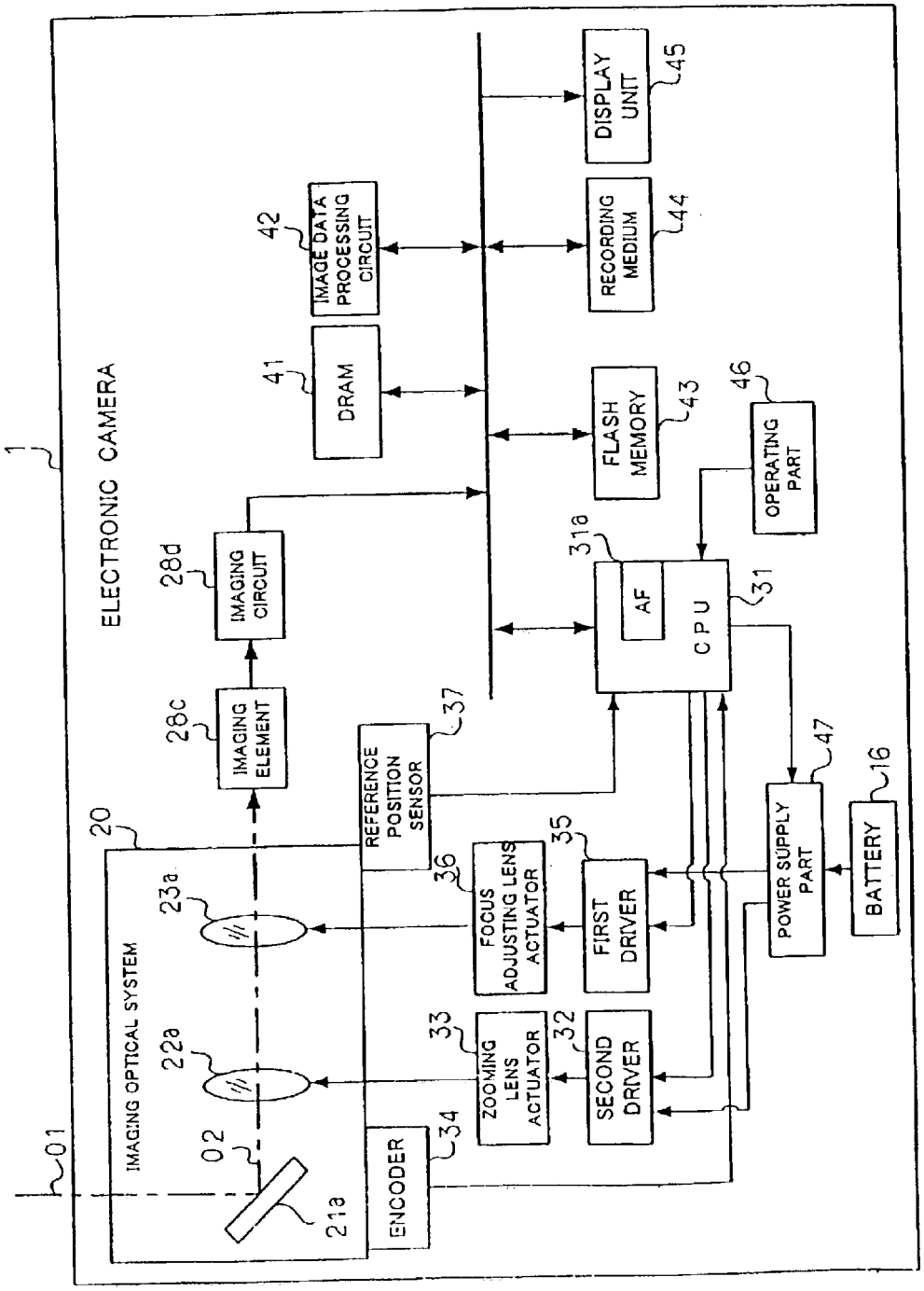
FIG. 3 is a block diagram, partly schematic, showing main electric internal constituent parts of the electronic camera.
Figure 4:
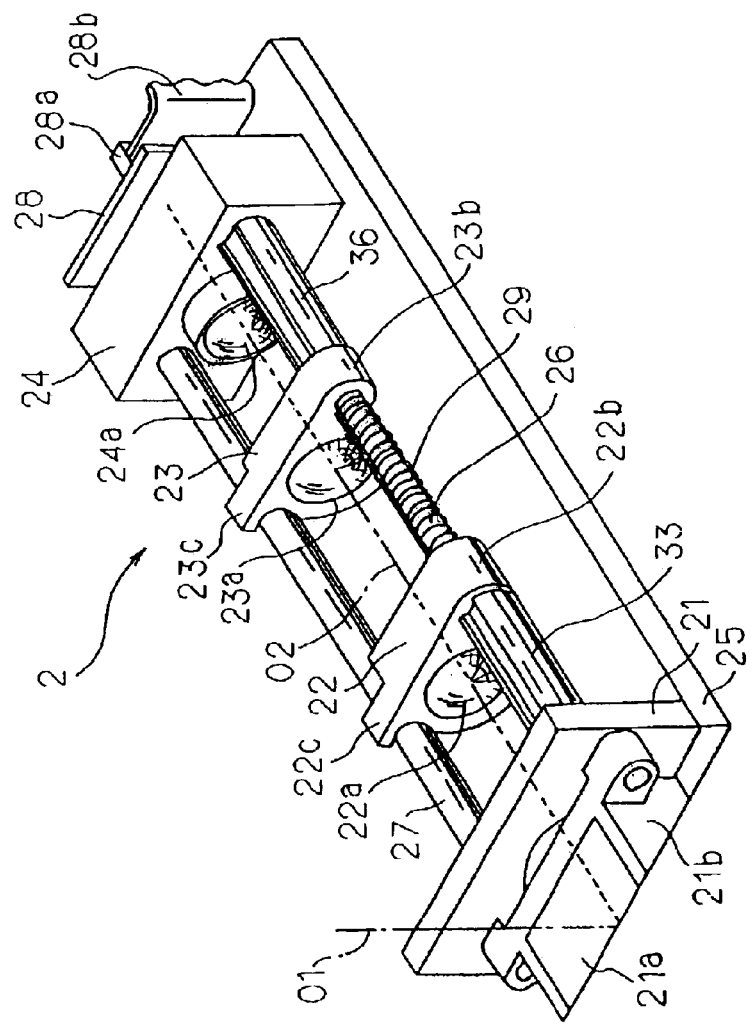
FIG. 4 is a perspective view showing the embodiment of the optical unit (or lens unit)
Figure 5:
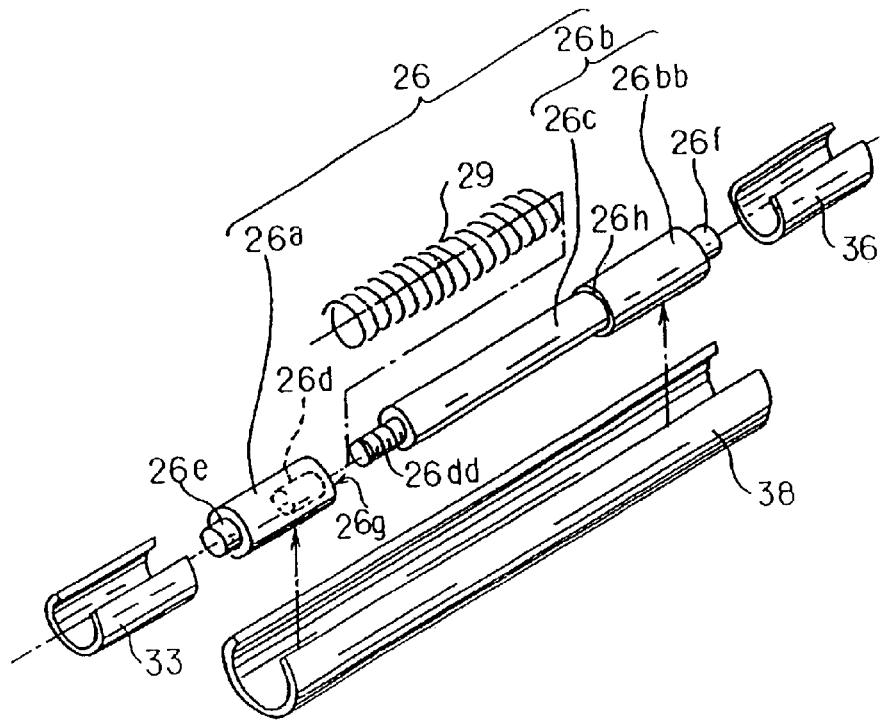
FIG. 5 is a fragmentary enlarged-scale exploded perspective view showing constituent parts means and a drive means of the optical unit (or lens unit) shown in FIG. 4.
Figure 6:
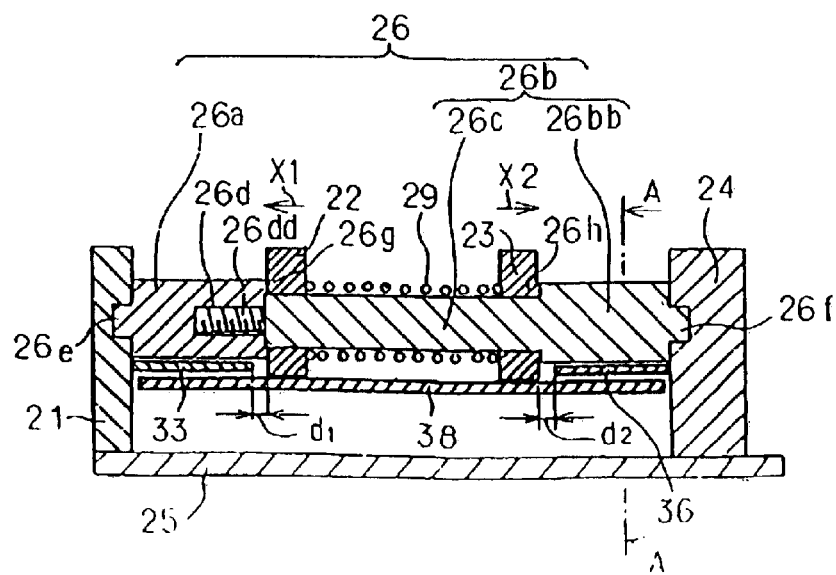
FIG. 6 is a sectional view of the optical unit shown in FIG. 4.

FIGS. 1 to 7 show a first embodiment of the present invention. In these Figures, FIG. 1 is a perspective view showing an electronic camera adopting the embodiment of the optical unit. FIG. 2 is a schematic perspective view showing main internal constituent parts of the electronic camera. FIG. 3 is a block diagram, partly schematic, showing main electric internal constituent parts of the electronic camera. FIG. 4 is a perspective view showing the embodiment of the optical unit (or lens unit). FIG. 5 is a fragmentary enlarged-scale exploded perspective view showing constituent parts (i.e., a guide means (or main guide shaft) and a drive means (or actuators, etc.) of the optical unit (or lens unit) shown in FIG. 4. FIG. 6 is a sectional view showing a predetermined locality (i.e., locality of the guide means and drive means in the optical unit (or lens unit) shown in FIG. 4. FIGS. 7(a) and 7(b) are sectional views taken along line A—A in FIG. 6.

First, the electronic camera adopting the embodiment of the optical unit will be described with reference to FIGS. 1 and 2.

As shown in FIGS. 1 and 2, the electronic camera 1 adopting the embodiment of the optical unit has various internal constituent parts, and its housing is constituted by a housing member 11 having a relatively small depth direction dimension. On top of the housing member 11, a plurality of various operating members such as a release button 12 as an operating member for instructing the execution of exposure are disposed. In FIGS. 1 and 2, no operating member other than the release button 12 is shown.

On the front side of the housing member 11, a strobo light emitting window 13 constituting part of a flashlight generating unit (not shown in FIG. 2) is disposed at a predetermined position in the neighborhood of the top edge 11a. An imaging lens window 14 as an objective optical system is disposed at a predetermined position adjacent to the strobo light emitting window 13. The imaging lens window 14 has a purpose of protecting part of an imaging lens unit 2 (see FIG. 2, hereinafter referred to as lens unit) as optical unit constituted by an imaging optical system or the like, i.e., the front surface of the objective optical system, and also has a purpose of serving as an opening for leading a foreground object light flux into the housing member 11.

In the electronic camera 1, a plurality of circuit boards 15 are disposed in a laminated (i.e. spaced parallel) fashion at a substantially predetermined central position such as to extend to the depth direction of the electronic camera 1.

On these circuit boards 15 are mounted various operation switches (not shown) interlocked to various operating members disposed on the outer surface of the housing member 11 for generating corresponding predetermined instruction signals. Predetermined instruction signals are thus generated in response to the operation of the corresponding operating members such as the release button 12.

An imaging element base 28, which is provided in the lens unit 2 and has an imaging element 28c (not shown in FIG. 2, refer to FIG. 3) mounted on it, is electrically connected by a predetermined means (not shown in FIG. 2, refer to a connector part 28a and a flexible printed circuit board 28b shown in FIG. 4) to the circuit boards 15.

Inside the electronic camera 1, a battery 16 as a main power supply of the electronic camera 1 is disposed at a predetermined position in the neighborhood of one end, i.e., one of two spaces defined in opposite ends of the circuit boards 15 noted above, the battery 16 and the circuit boards 15 are connected to one another by predetermined power supply connection lead lines (not particularly shown). Power of the battery 16 is thus supplied to a predetermined power supply circuit or the like to the circuit boards 15.

At the other end space in the electronic camera 1, the embodiment of the optical unit, i.e., the lens unit 2, is secured in position.

The schematic constructions of main electronic internal constituent parts in the electronic camera 1 will now be described with reference to FIG. 3.

The electronic camera 1 comprises an imaging optical system 20, which includes a plurality of optical elements such as a reflector 21a as an optical element for converting the direction of progress of a light flux from a foreground object (hereinafter referred to as foreground object light flux), a zooming lens 22a as an optical element contributing to a zooming operation and a focus adjusting lens 23a as an optical element contributing to a focus adjusting operation, an imaging element 28c such as a charge-coupled device (CCD), which is mounted on the imaging element base 28 (see FIG. 2) for receiving and photo-electrically converting a foreground object image formed by a foreground object light flux transmitted through an imaging optical system 20, an imaging circuit 28d for receiving an output signal from the imaging element 28c and executing various signal processes such as CDS (correlated double sampling) signal process, AGC (auto gain control) signal process and AD (analog/digital) signal process on the received signal to generate image data of a predetermined form, a DRAM (dynamic random access memory) 41 for provisionally storing the image data generated by the imaging circuit 28d, a flash memory 43 as a recording medium, in which programs for operation controls of the electronic camera 1 are stored, a recording medium 44 (such as a semiconductor memory, a magnetic recording memory and an optical recording memory), which is detachably provided in the electronic camera and serves to preserve the obtained image data, an image data processing circuit 42 for executing compression and de-compression processes on the image data and image data read-out and write-in with regard to the recording medium 44, a display unit 45 such as an LCD (liquid crystal display) unit for converting the image data to display data of a best form for display and executing image display according to the display data thus obtained, an operating part 46, which includes various operating members (such as the release button 12 (see FIGS. 1 and 2), a zoom member and various mode switching dials) and various operation switches for generating predetermined instruction signals in interlocked relation to these elements, the above elements being provided on the outer surface of the housing member 11 of the electronic camera 1, a power supply part 47, which includes a DC-DC converter, a power supply circuit and so forth and serves to receive power supplied from the battery 16 and control the received power for distribution thereof to various electric members, the battery 16 which is a main power supply and constituted by a secondary battery such as a dry cell or a lithium battery and an AF (auto focus) circuit 31a contributing to the focus adjusting operation. The electronic camera 1 further comprises a control circuit, i.e., a CPU (central processing unit) 31 serving to electrically collectively control the entire system of the electronic camera 1, a focus adjusting actuator 36 for driving the focus adjusting lens 23a, a first driver 35 as a drive control means for executing drive control of the focus adjusting actuator 36 by receiving instructions from the CPU 31 and thus contributing to the focus adjusting operation, a reference position sensor 37 serving as a detecting member for detecting the reference position of the focus adjusting lens 23a, a zooming lens actuator 33 for driving the zooming lens 22a, a second driver 32 for executing drive control of the zooming lens actuator 33 by receiving instructions from the CPU 31 and thus contributing to the zooming operation and an encoder 34 serving as a detecting member for detecting displacement of the zooming lens 22a.

The compression and de-compression processes executed in the above image data processing circuit are the following signal processes. The compression process converts the image data generated in the imaging circuit 28d to compressed data of a best form for recording in a predetermined recording area in the recording medium 44 and writing (or recording) the compressed data thus obtained. The de-compression process converts the compressed image data read from the recording medium 44 to image data of the predetermined form.

The construction of the lens unit as this embodiment applied to the electronic camera will now be described in detail with reference to FIGS. 4 to 7.

As described above, the lens unit 2 is disposed in the electronic camera 1 at a predetermined position. As shown in FIG. 4, the lens unit 2 is constituted by a plurality of lenses 22a to 24a as optical elements contributing to the imaging (i.e., formation of the foreground object image), a plurality of frame members 22 to 24 for holding the optical elements (i.e., lenses), respectively, the actuators 33 and 36 as lens frame drive members for causing movement of the frame members in predetermined directions (i.e., directions along the optical axis O2), and the reflector 21a as an optical element for bending the optical path of a foreground object light flux incident on the lens unit 2 to the side of the light-receiving surface of the imaging element 28c (see FIG. 3) disposed at a predetermined position.

As shown in FIG. 3, the light flux incident side (or foreground object side) optical path in the reflector 21a is designated by symbol O1. The optical axis O1 is referred to as the first optical axis. Also as shown in FIG. 3, the optical axis which is perpendicular to the first optical axis O1 is designated by symbol O2, and it is referred to as the second optical axis. The second optical axis O2 shows the center axis of light flux passing through the substantial centers of the zooming lens 22a, the focus adjusting lens 23a and the stationary lens 24a to be led to the light-receiving surface of the imaging element 28c (see FIG. 3) of the imaging element base 28.

The lens unit 2 has a following specific construction. The various constituent parts of the lens unit 2 are disposed on top of a lens unit base (hereinafter merely referred to as base) 25 at predetermined positions, respectively.

The imaging optical system 20 of the lens unit 2 (see FIG. 3) constitutes a bending optical system. The imaging optical system 20 has a plurality of optical elements (or lenses), such as a reflector 21a, a prism and a reflecting mirror of optical glass or like material, a zooming lens 22a capable of being moved in directions along the optical axis O2 according to predetermined instruction signals and thus contributing to the zooming operation, a focus adjusting lens 23a for executing the focus adjusting operation and also compensating for deviation or the like of the focus adjusted state arising from the zooming operation, and the stationary lens 24a for focusing the foreground object image on the light-receiving surface of the imaging element 28c (not shown in FIG. 4, see FIG. 3).

These optical elements (or lenses) are disposed in a row in the order, from the position nearest to the foreground object, of the reflector 21a, the zooming lens 22a, the focus adjusting lens 23a and the stationary lens 24a. The imaging element base 28 with the imaging element 28c (see FIG. 3) mounted thereon, is disposed at a predetermined position behind the stationary lens 24a and at an orientation perpendicular to the optical axis O2.

The connector part 28a is mounted on a mounting surface of the imaging element base 28 at a predetermined position thereof. The imaging element base 28 is electrically connected via the flexible printed board 28b, which is connected to the connector part 28a, to part of the circuit substrates 15 with the image signal processing circuits mounted thereon.

The reflector 21a is held in the reflector frame 21b, which is secured to the support wall 21 secured to the neighborhood of one end of the image element base 25. The reflector frame 21b supporting the reflector 21a is secured by a screw member or like coupling means to the support wall 21. The reflector 21a is thus held secured in a predetermined position on the imaging element base 25.

The reflector 21a is an optical element, which serves to bend the light flux from a foreground object present at a position to face the front of the electronic camera, i.e., the foreground object light flux and lead the bent light flux to the side of the imaging element 28c (not shown).

The reflector 21a mounted on the reflector frame 21b has a reflecting surface inclined substantially by 45 degrees from the optical axes O1 and O2 shown in FIG. 4. In other words, the reflecting surface is disposed such as to face a foreground object present on the extension of the optical axis O1 and the lenses 22a to 24a and the imaging element 28c, which is mounted on the imaging element base 28, present on the extension of the optical axis O2.

The stationary lens 24a is held stationary at a predetermined position on top of the imaging element base 25 by a stationary lens frame 24, which is secured in position in the neighborhood of the other end of the base 25.

Between the support wall 21 and the stationary lens frame 24, a main and an auxiliary guide bar 26 and 27 are supported, which are guide members, more specifically straight bar-like guide members, constituting part of a guide means for guiding the zooming lens frame 22 (supporting the zooming lens 22a) and the focus adjusting lens frame 23 (supporting the focus adjusting lens 23a) as these guide frames are moved in predetermined directions, i.e., directions along the optical axis O2.

The main and auxiliary guide bars 26 and 27 are fitted in the plurality of lens frames 22 and 23, which are disposed side by side in the direction of the optical axis O2 and support the optical elements 22a and 23a, respectively.

Of the two guide bars (i.e., main and auxiliary guide bars 26 and 27) constituting the guide means, the main guide bar 26 serves the role of guiding the zooming and focus adjusting lens frames 22 and 23 as these lens frames are moved in directions along the optical axis O2.

The auxiliary guide bar 27, on the other hand, serves the role of preventing the rotation of the zooming and focus adjusting lens frames 22 and 23 about the main guide bar 26 as well as the role of guiding the two lens frames 22 and 23 in the movement thereof in opposite directions along the optical axis O2.

To this end, the main and auxiliary guide bars 26 and 27 are provided such that they extend parallel to the directions of movement of the two lens frames 22 and 23 (i.e., directions along the optical axis O2). The two lens frames 22 and 23 are movably fitted on the main and auxiliary guide bars 26 and 27.

The main guide bar 26 has a structure as shown in FIGS. 5 to 7. As shown, the main guide bar 26 is a bar member constituted by a shaft and a long bar member 26a and 26b. The short bar member 26a has an extension 26b formed at one end and secured to the support wall 21, and it is formed at the other end with a threaded hole 26d for coupling to the long bar member 26b. The zooming actuator 33 is provided on the outer periphery of the short bar member 26a.

On the long bar member 26b is fitted (wound) a biasing member 29 serving as a biasing means constituted by a coil member, for instance, capable of being elongated. The long bar member 26b is formed by making a small diameter member 26c, on which the zooming and focus adjusting lens frames 22 and 23 are slidably fitted, and a large diameter member 26bb, which supports the focus adjusting lens actuator 36 fitted on the outer periphery, to be integral with each other. In this case, the diameter of the large diameter member 26bb is set to be substantially the same as the diameter of the short bar member 26a.

The small diameter member 26c is formed at one end with a thread 26dd, which is fitted in the threaded hole 26c in the short bar member 26a. The large diameter member 26bb has an extension 26f formed at one end and secured to the stationary lens frame 24.

The main guide bar 26 is thus formed to be a bar member with the short and long bar members 26a and 26b made to be integral with each other by the screwing of the threaded hole 26b and the thread 26dd with each other. With the main guide bar 26 having the above structure, the extensions 26e and 26f formed at the opposite ends are secured to and supported by the support wall 21 and the stationary lens frame 24, respectively.

As shown in FIGS. 4 and 6, the zooming and focus adjusting lens frames 22 and 23 are slidably disposed on the small diameter member 26c of the long bar member 26b of the main guide bar 26, and the biasing member 29 is fitted on the outer periphery of the small diameter member 26c in the space between the two lens frames 22 and 23 such that it is clamped therebetween.

Thus, normally the two lens frames 22 and 23 are held biased in predetermined directions, i.e., directions of arrows X1 and X2 in FIG. 6, by biasing forces of the biasing member 29 in the elongation directions thereof. That is, the zooming and focus adjusting lens frames 22 and 23 are biased in the directions of arrows X1 and X2, respectively, in FIG. 6 by the biasing force of the biasing member 29 in the elongation directions thereof.

As will be described later, the biasing forces of the biasing member 29 act to bias the two lens frames 22 and 23 in directions opposite to the directions of driving of the two lens frames 22 and 23 by the drive means (i.e., actuators 33 and 36).

The two lens frames 22 and 23 are positioned at predetermined positions in contact with other end 26g of the short bar member 26a and one end 26h of the large diameter member 26bb of the long bar member 26b, respectively.

The biasing member 29 serves the role of positioning the zooming and focus adjusting lens frames 22 and 23 at predetermined positions in the normal state without driving of the zooming lens and focus adjusting lens actuators 33 and 36.

The zooming lens actuator 33 is disposed on the outer periphery of the short bar member 26a, while the focus adjusting lens actuator 36 is disposed on the large diameter member 26bb of the long bar member 26b. In this case, the two actuators 33 and 36 are provided such that they are fitted on the outer periphery of the short and long bar members 26a and 26b, respectively.

The zooming lens actuator 33 has one end in contact with the support wall 21, while the other end of the focus adjusting lens actuator 36 is in contact with the stationary lens frame 24.

The zooming actuator 33 has its size preset such that a slight clearance d1 is defined between its other end and the zooming lens frame 22 in the normal state, in which the two actuators 33 and 36 are not energized. In the same state, the focus adjusting actuator 36 has its size preset such that a sight clearance d2 is defined between one end of it and the focus adjusting lens frame 23.

Specifically, the two actuators 33 and 36 are provided in such a state that they are fitted on the outer periphery of the main guide bar 26 at predetermined positions, respectively, and they each have one end in contact with a corresponding side stationary part of the support wall 21 and the stationary lens frame 24. Also, the two actuators 33 and 36 each have the other end disposed at such a positions to be able to push the corresponding one of the two lens frames, i.e., the zooming and focus adjusting lens frames 22 and 23, and in their non-energized state they are disposed to define the predetermined clearances d1 and d2 with the corresponding lens frames 22 and 23.

In the non-energized state, when the zooming actuator 33 is energized, its other end is brought into contact with and pushes part of the zooming lens frame 23 in the neighborhood of fitting with the main guide bar 26, thus moving the zooming lens frame 22 in a direction along the optical axis O2, i.e., the direction of arrow X1.

When the focus adjusting actuator 36 is energized, its other end is brought into contact with and pushes part of the focus adjusting lens frame 23 in the neighborhood of fitting with the main guide bar 26, thus moving the focus adjusting lens frame 23 in a direction along the optical axis O2, i.e., the direction opposite to the direction of arrow X2.

A cover member 38 is disposed to cover the outer periphery of the main guide bar 26 and the two actuators 33 and 36 (see FIGS. 5 to 7(a), not shown in FIG. 4). The cover member 38 is provided for such purposes as suppressing deformation of the two actuators 33 and 36 in non-intended direction, i.e., mainly in radial directions, of the main guide bar 26 and protecting the outer surfaces of the two actuators 33 and 36.

By summarizing the essential part of the construction described above with reference to FIGS. 4 to 7(a), the construction of the actuator, the description of which has been partly omitted in the above, as well as the periphery of the construction, will now be described in detail with reference to FIG. 7(b).

A main guide bar (i.e., main guide bar 26) is provided, which restricts the direction, in which lens frames 23 and 22 provided as lens support members provided to support and be able to be moved in unison with lenses 23a and 22a capable of being displaced for desired optical adjustment such as focus adjustment and zooming is displaceable, is along the second optical axis shown in FIG. 4 as a predetermined direction. Along the outer periphery of the guide bar 26, an actuator element 36e is provided, which includes curved plate-like electrostriction elements (i.e., actuators 33 and 36 in the embodiment) of a polymer material layer laminate, which are formed curvedly in a state that they are wound on a fixed part of the periphery (i.e., a part more than one half of the circumference in the direction of the cross section) and can produce drive displacement of expansion or compression in the longitudinal direction of the guide bar 26 in response to a drive voltage applied across themselves (i.e., voltage control, see FIG. 3 for application and removal of the voltage), the drive voltage being capable of being transferred to the lens support members 23 and 22.

The electrostriction elements (i.e., actuators 33 and 36) of the actuator element 36e each have a release part 36c which is formed on a part of the annular, i.e., substantially cylindrical outer periphery and extends in the axial direction.

Figure 7A:
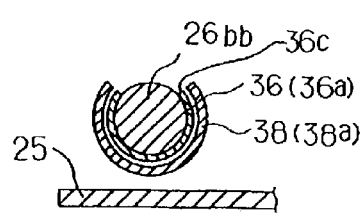
FIGS. 7(a) and 7(b) are sectional views taken along line A—A in FIG. 6 respectively showing an actuator without and with a biasing element.
Figure 7B:
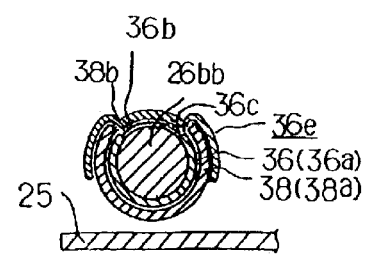

Referring to FIG. 7(b) for further detailed description, the actuator element 36a further includes a biasing element 36b for generating a pre-strain (i.e., a preliminarily given strain) in the curved plate-like element (i.e., actuator 36) such as to cause strain or expansion of the electrostriction element in a curved circumferential direction.

In the illustrated example, the biasing element is constituted by a spring element (i.e., pre-strain element), which generates a biasing force in a direction of contracting itself at all times so as to give the curved plate-like electrostriction element (i.e., actuator 36) a stress in a direction of causing elongation of the electrostriction element.

The electrostriction element 36 of the actuator element has a release part 36e formed in a part of the substantially cylindrical outer periphery and extending in the axial direction, and in the release part a biasing element 36 is disposed for giving the electrostriction element a pre-strain such as to cause expansion of the electrostriction element in curved circumferential direction thereof. Although not shown, the other electrostriction element (i.e., actuator 33) has the same construction.

As an example of the elastic member noted above, a curved plate-like spring is used, which extends in an axial direction (i.e., in a direction perpendicular to the plane of the figure) perpendicular to the direction of action of the bias force and is saw-wave like in cross-sectional form.

The actuator element 36a further includes a cover member 38, which is provided on the side of the outer periphery of the curved plate-like electrostriction element 36. Another cover member 38b is also provided on the side of the outer periphery of the curved plate-like electrostriction element such that it covers an open part side of the cover member 38.

The curved plate-like electrostriction element 36 is disposed such that one end of it in its axial direction (i.e., direction along the second optical axis) is in contact with a stationary part (i.e., stationary lens frame 24) and also that, with expansion displacement of the electrostriction element caused by application thereacross of a drive voltage, its other end is brought into contact with the lens support member (i.e., lens frame 23). In this respect, the other electrostriction element (i.e., actuator 33) has the same construction as described above. In this embodiment, the actuator elements are provided such that each of them corresponds to the shown lens support member.

The auxiliary guide bar 27 has its opposite ends held secured to and supported by the support frame 21 and the stationary lens frame 24, respectively.

The main and auxiliary guide bars 26 and 27 are coupled to the zooming and focus adjusting lens frames 22 and 23, respectively, by the following means.

One end part 23b of the focus adjusting lens frame 23 has a through-hole extending along the second optical axis O2, and the main guide bar 26 penetrates the through-hole. Thus, the focus adjusting lens frame 23 is fitted and slidably supported on the main guide bar 26.

The other end part 23c of the focus adjusting lens frame 23 has a bearing part having a substantially U-shaped cross-sectional profile, and the auxiliary guide bar 27 is received in this bearing part. Thus, the auxiliary guide bar 27 has roles of preventing the rotation of the focus adjusting lens frame 23 about the main guide bar 26 and guiding the focus adjusting lens frame 23 in the movement thereof in directions along the second optical axis O2.

As for the zooming lens frame 22, one end 22b thereof has a through-hole like the through-hole of the focus adjusting lens frame 23 and extending along the second optical axis O2, and the main guide bar 26 penetrates the through-hole. Thus, the zooming lens frame 22 is fitted and slidably supported on the main guide bar 26.

The other end part 22c of the zooming lens frame 22, like the above focus adjusting lens frame 23, has a bearing part having a substantially U-shaped sectional profile, and the auxiliary guide bar 27 is received in this bearing part. Thus, quite like the above case of the bearing part of the focus adjusting lens frame 23, the auxiliary guide bar 27 has the roles of preventing the rotation of the zooming lens frame 22 about the main guide bar 26 and guiding the zooming lens frame 22 in the movement thereof in directions along the second optical axis O2.

In the above way, the main and auxiliary guide bars 26 and 27 penetrate the zooming lens frame 22 for supporting the zooming lens 22a secured thereto and the focus adjusting lens frame 23 for supporting the focus adjusting lens 23a secured thereto, and support the two lens frames 22 and 23 such that the lens frames can be moved independently in directions along the second optical axis O2.

As described above, the drive means, i.e., the actuators 33 and 36 as lens drive members for causing movement of the zooming and focus adjusting lens frames 22 and 23 as driven members in directions along the second optical axis O2, are disposed on the main guide bar 26 such that they are fitted on the outer periphery of the main guide bar 26 at predetermined positions.

In other words, the actuators 33 and 36 in this embodiment are provided along the main guide bar 26 and independently for the zooming and focus adjusting lens frames 22 and 23, respectively.

The actuators 33 and 36 consist of electrostriction devices (see FIG. 17) utilizing the electrostriction effect for obtaining drive power, and serve as drive means for driving the zooming and focus adjusting lens frames 22 and 23.

The actuators 33 and 36 are electrically connected by predetermined connecting means to the circuit substrates 15, and predetermined operation controls are made according to instructions from the CPU 31 mounted on the circuit substrates 15.

As described above, the construction of the embodiment of the optical unit (i.e., lens unit 2) is set forth.

In the optical unit in a conventional electronic camera or the like, the zooming and focus adjusting operations are actually realized by causing movement of corresponding predetermined lenses in directions along the optical axis.

Figure 19:
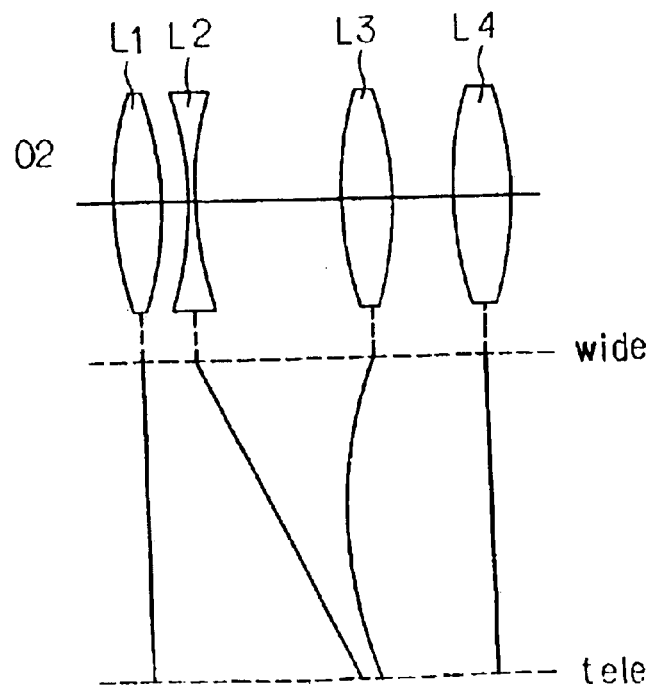
FIG. 19 is a view showing the structure of the optical imaging system in the optical unit in the usual electronic camera or the like and also the state of dispositions of a plurality of lenses constituting the imaging optical system when the lenses are operated.

FIG. 19 is a view showing the structure of the optical imaging system in the optical unit in the conventional electronic camera or the like and also the state of dispositions of a plurality of lenses constituting the imaging optical system when the lenses are operated.

Referring to FIG. 19, a first lens group L1 is an objective lens, a second lens L2 is a zooming lens, a third lens L3 is a focus adjusting lens, and a fourth lens L4 is a stationary lens.

In the electronic camera having the imaging optical system with the above construction, the zooming operation is executed as follows. Functionally, the embodiment of the electronic camera 1 is like the following electronic camera described hereinafter. In the following description, the construction of electronic camera 1 shown in FIGS. 1 to 3 will be described.

The zooming operation is started when the user operates a predetermined operating member i.e., zoom lever (not shown), which is operated when it is desired to execute the zooming operation. Thus, a predetermined designation signal (i.e., zooming instruction signal in this case) is generated by an element (not shown) of the operation part 46. Zooming instruction signals represent such instructions as a zoom-up instruction for a zooming operation from wide side to tele side and a zoom-down instruction for a zoom-down instruction from the tele side to the wide side. The generated zooming instruction signal is fed to the control circuit (i.e., CPU 31).

Receiving this signal, the control circuit (CPU 31) executes drive control of the zooming actuator 33 via the zooming driver (i.e., second driver 32) and executes interlocked drive control of the focus adjusting actuator 36 via the focus adjusting driver (i.e., first driver 35).

Thus, the zooming lens frame 22 for holding the second lens L2 (i.e., zooming lens 22a) and the third lens L3 (focus adjusting lens 23a), are moved to predetermined extents in predetermined directions along the optical axis O2.

The drive control of the third lens (i.e., focus adjusting lens 23a) is executed at the same time for compensating operation to compensate for a displacement of the point of focus accompanying the zooming operation.

The compensating operation is such as to cause displacement (or feedback) of the position of the third lens L3 (i.e., focus adjusting lens 23a) for obtaining the maximum contrast of the foreground image, obtained by the imaging element 28c, by analyzing the foreground object image obtained by the imaging element 28c, the AF circuit 31a in the control circuit (i.e., CPU 31). This control is usually executed in prior art electronic cameras or the like.

When executing the zooming operation in the usual electronic camera or the like, the zooming lens frame 22 holding the second lens L2 (i.e., zooming lens 22a) and the focus adjusting frame 23 holding the third lens L3 (i.e., focus adjusting lens 23a) may be moved about 10 mm.

The focus adjusting operation executed in the imaging optical system in the usual electronic camera, on the other hand, is usually included in an operation, which is executed right before the exposure operation.

For performing the imaging operation in the usual electronic camera or the like, the release button 12 is usually operated usually by a first stage operation to cause execution of the exposure operation and focus adjusting operation, and is then operated by a second stage operation to cause execution of the exposure operation, i.e., drive control of a stop, a shutter, etc.

Specifically, by executing the first operation of a predetermined operation member (i.e., release button 12), which is provided for executing an imaging preparation when desired by the user, an imaging preparation operation of the focus adjusting operation is started.

In this case, in response to the operation of the operation member such as the release button 12, a predetermined instruction signal (in this case a focus adjusting instruction or like signal) is generated from the operating part 46. This focus adjusting instruction signal is fed to the control circuit (i.e., CPU 31).

Receiving this signal, the control circuit (or CPU 31) executes drive control of the focus adjusting actuator 36 via the focus adjusting driver (i.e., first driver 35). As a result, the focus adjusting lens frame 23 holding the third lens L3 (i.e., focus adjusting lens 23a) is moved to a predetermined extent in a direction along the optical axis O2.

The focus adjusting operation is such as to cause displacement (or feed-back) of the position of the third lens L3 (focus adjusting lens 23a), obtained by the imaging element 28c, by analyzing the foreground object image with the AF circuit 31a of the control circuit CPU 31. Such focus adjusting operation is usually made in the prior art electronic camera or the like.

When executing the focus adjusting operation in the usual electronic camera or the like, the focus adjusting lens frame 23 holding the third lens L3 (i.e., the focus adjusting lens 23a) is usually moved by about 1 mm in the positive and negative (±) directions.

Figure 17:
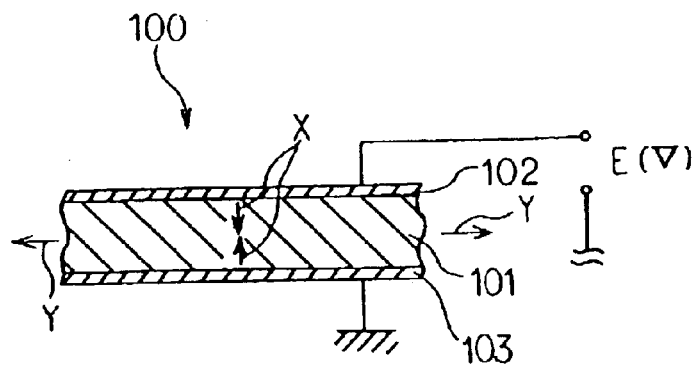
FIG. 17 is a view schematically showing the construction of the electrostriction actuator described in the above literature.
Figure 18:
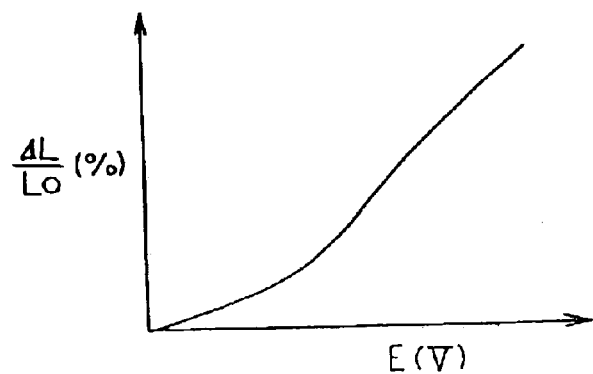
FIG. 18 is a graph showing the relation between the distortion caused by voltage application to the electrostriction actuator and the applied voltage.

The actuators 33 and 36 in this embodiment of the optical unit are constituted by using a predetermined polymer material (see FIG. 17). An example of the polymer material is "HS3 silicone Prestrain (x, y) (%)=(280.0).

"HS3 silicone" is a product name, in which "silicone" means an organic silicone compound polymer, and "Prestrain" means preliminary strain.

Thus, "HS3 silicone Prestrain (x, y) (%)=280.0" means a material obtained by causing strain of a thin film-like material "HS3 silicone" on a plane in x-direction by 280%.

In the case when an electrostriction actuator using the above polymer material is strained by applying a voltage of 128 V/$\mu$m across it in a direction perpendicular to the direction of prestrain, the relative strain ratio is 117%, and the effective compression stress generated when the electrostriction actuator undergoes expansion is calculated from the above data to be 0.4 MPa. The result of the above experimental calculation is publicized by SRI International, a non-profit independent research organization (see "2000 Micro-Machine Technique Research Development (power generation facility high functional maintenance technical development) Commission Research Result Report", Foundation Micro-Machine Center, Monthly March, 2001, pp. 540–541 and Table 4.1-2 on pp. 641).

In this case, the direction of deformation (i.e., strain) of the polymer material is a direction (i.e., y-direction) substantially perpendicular to the prestrain direction (i.e., x-direction) on a plane in the direction of electric field applied to the electrode layers, i.e., a direction substantially perpendicular to the direction of pressure application caused by the applied voltage, that is, the plane of the polymer material.

It can be derived from the experimental data that, in the case of setting the length dimension of the electrostriction actuator meeting the above conditions to about 10 mm, application of a voltage of 128 V/$\mu$m across the 10-mm long electrostriction actuator undergoes strain (or deformation) by a length of about 11.7 mm in a predetermined direction (i.e., y-direction) perpendicular to the prestrain direction (i.e., x-direction).

As a condition of the supply voltage on a usual small-size unit such as an electronic camera, the voltage is usually held to be no higher than 100 V.

With the above condition taken into consideration, the condition of the thickness dimension of the polymer material for obtaining the same result (i.e., prestrain ratio of 117%) as the case of applying a voltage of 128 V/$\mu$m when a voltage of 100 V is applied across "HS3 silicone Prestrain (x, y) (%)=280.0", can be determined from the following equations.

$$128(V)/1(\mu m)=100(V)/x(\mu m)$$

and $$x(\mu m)=0.78(\mu m).$$

Thus, the thickness dimension (i.e., thickness) T of the electrostriction actuator may be set to T=7.78 $\mu$m. This means that it is possible to arrange such as to be above to obtain a desired strain (or deformation) in the case of executing the drive control with a voltage of 100 V as well.

As described before, in this embodiment of the optical unit (i.e., lens unit 2), the biasing force of the biasing member 29 is always acting between the zooming and focus adjusting lens frames 22 and 23. Thus, drive power in excess of the biasing force of the biasing member 29 is necessary for causing movement of the two lens frames 22 and 23 to predetermined extents in predetermined directions against the biasing force of the biasing member 29.

The drive forces of the actuators 33 and 36 in this embodiment of the optical unit are generated with deformation (or strain) of a predetermined polymer material.

Thus, in the case in which the biasing force of the biasing member 29 in the embodiment of the lens unit 2 is F=20 gf, for obtaining, with the actuators 33 and 36, the drive forces to cause movement of the two lens frames 22 and 23 against the biasing force, i.e., F=20 gf, of the biasing member 29, the condition of the length dimension of the pertinent actuators 33 and 36 has to be set as follows.

It is assumed that the electrostriction actuators are made of polymer material of "HS3 silicone Prestrain (x, y) (%) m=280.0) having a thickness of 0.78 $\mu$m. It is also assumed that the biasing force of the biasing member 29 is F=20 gf. Then, with a voltage of 100 V applied to the electrostriction actuator, the effective pressure when the pertinent electrostriction actuators undergo strain is 0.4 MPa. Thus, the length dimension (m) of the actuators 33 and 36 can be obtained from the following inequality.

$$0.4(MPa) \times (0.78 \times 10^{-6}(m)) \times L(m) > (20 \times 10^{-3}(Kg)) \times 9.8(m/s2) \therefore L(m) > 0.6m$$

It will be seen that a length dimension of at least L=60 cm is necessary in order to be able to withstand F=20 gf of the biasing force of the biasing member 29 by using the electrostriction actuators meeting the above conditions.

However, when it is considered to apply the embodiment of the optical unit to a small size device, L=60 cm can not be directly adopted. To readily solve this problem for applying electrostriction actuators with a length dimension of 60 cm while realizing size reduction of the device, the electrostriction actuators may be formed to have a laminate structure.

Figure 8:
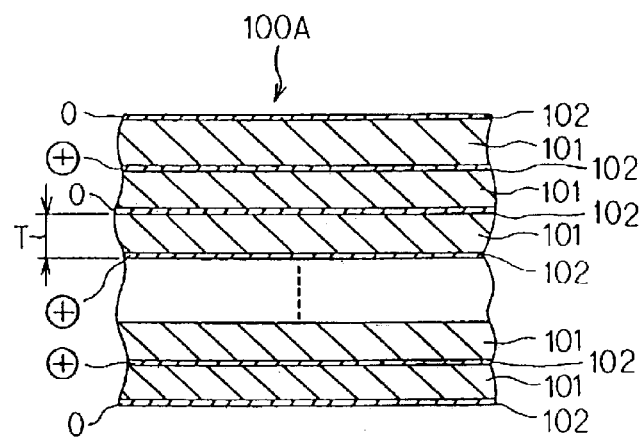
FIG. 8 is a schematic view showing the structure of an electrostriction actuator having a laminate structure for application to the embodiment of the optical unit.
Figure 9:
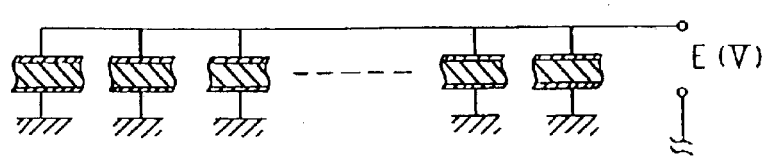
FIG. 9 is a schematic view showing electric connections in the electrostriction actuator having the laminate structure.

FIG. 8 is a schematic view showing the structure of an electrostriction actuator having a laminate structure for application to the embodiment of the optical unit. FIG. 9 is a schematic view showing electric connection in the electrostriction actuator having the laminate structure.

The electrostriction actuator 100A shown in FIG. 8 has a structure which, like the case shown in FIG. 17, comprises thin polymer films 101 of a polymer and electrode layers 102. The actuator 100A has a laminate structure formed as an alternate lamination of the thin polymer films 101 and the electrode layers 102.

As the electrode layers 102, those with a voltage applied thereto (i.e., layers labeled a mark of a cross (+) in a circle in FIG. 8) and layers which are grounded (i.e., layers labeled a mark of "0" (zero) in FIG. 8) are alternately laminated. When producing the laminate structure, the individual layers constitute respective electrostriction actuators, which are connected in electrical parallel as shown in FIG. 9.

Figure 10:
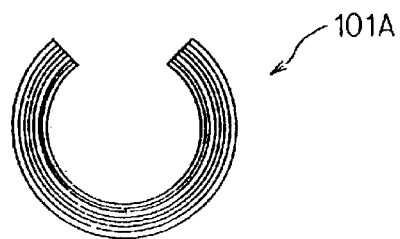
FIGS. 10 to 12 show end views of various embodiments of the electrostriction actuators.
Figure 11:
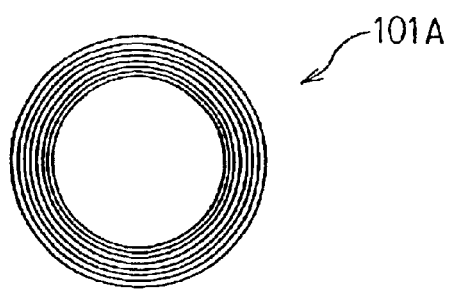
Figure 12:
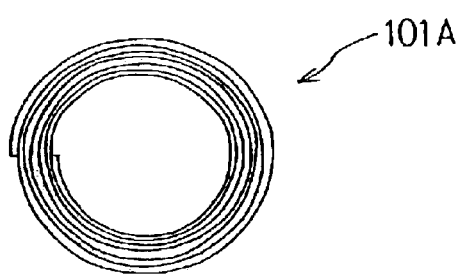

When forming such electrostriction actuators such as to constitute a laminate structure, various forms (shown by 101A) are possible, as shown in FIGS. 10 to 12, for instance.

In this embodiment of the lens unit 2, as described before, the two actuators, i.e., the zooming and focus adjusting actuators 33 and 36, are provided such as to be able to fit on the main guide bar, i.e., in a state that they are windingly fitted on the outer periphery of the main guide bar 26 at predetermined positions.

Each of the actuators 33 and 36 are thus formed such that they have a substantially cylindrical shape. Assuming the diameter of the substantially cylindrical actuators 33 and 36 to be D=5 mm, the circumferential dimension thereof is D(mm)×π, which is about 15 mm. Thus, the number of layers is obtained as $$60(cm)/1.5(cm)=40 \text{ layers}.$$

It will thus be seen that when the actuators 33 and 36 are formed by forming the material with a length dimension of L=60 cm into a substantially cylindrical shape with a diameter of D=5 mm, a laminate structure constituted by at least 40 layers is obtainable.

As described before, the thickness dimension (or thickness) T of each layer (see FIG. 8) is set to 0.78 $\mu$m, and the thickness dimension t of the laminate structure actuators 33 and 36 themselves is thus $$t=40\times0.78(\mu m)=\text{about } 3.5 \ (\mu m).$$

From the above considerations, the actuators 33 and 36 to be applied to the embodiment of the lens unit 2 may have the following form.

Figure 13:
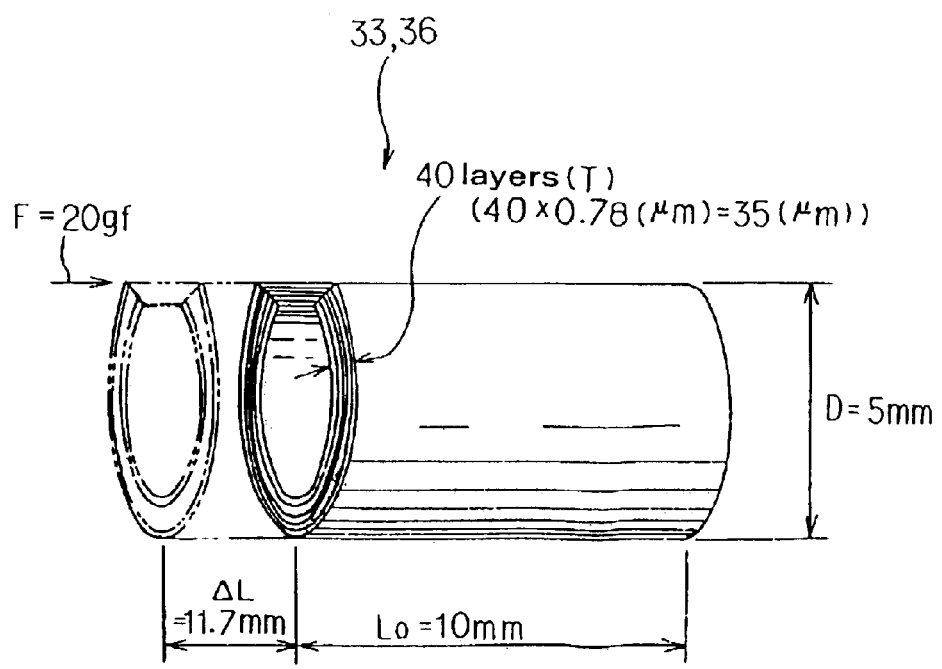
FIG. 13 is an enlarged-scale schematic perspective view of the actuator applied to the embodiment of the optical unit.

FIG. 13 is an enlarged-scale schematic perspective view of the actuator applied to the embodiment of the optical unit (or lens unit).

The actuators 33 and 36 each have the laminate structure constituted by at least 40 layers, and the thickness of each layer is preset to T=0.78 $\mu$m. The thickness dimension of the actuators 33 and 36 themselves is thus at least y=35 $\mu$m.

The actuators 33 and 36 also have their diameter preset to D=5 mm, and their length dimension in the direction and strain is preset to Lo=10 mm. As the polymer material is used (HS3 silicone Prestrain (x, y) (%)=280.0).

When a voltage of 100 V is applied across the actuators 33 and 36 having the above form, the actuators 33 and 36 undergo predetermined expansion in a predetermined expansion direction (i.e., direction along the main guide bar 26 and direction of movement of the optical element) with a strain (expansion) ratio of 117% against the biasing force of F=20 gf provided by the biasing member 29.

The strain (expansion) rate of the actuators 33 and 36 at this time is L=7 mm. Thus, the actuators 33 and 36 secure the necessary and sufficient strain rate for the zooming and focus adjusting operations of the optical unit (or lens unit 2) adopting them.

The functions of the electronic camera 1 adopting the embodiment of the optical unit having the above construction will now be briefly summarized.

First, the user of the electronic camera 1 starts the electronic camera 1 by operating a predetermined operating member, for instance a power supply operating member (not shown) which is interlocked to the power supply switch.

Then, the user determines the foreground object desired to be imaged, and determines the imaging angle of the imaging optical system covering a desired imaging zone including the foreground object. To this end, the user operates a predetermined operating member, for instance a zoom lever. In response to this operation, a zooming instruction signal instructing the execution of the zooming operation is generated. This zooming instruction signal is fed to the CPU 31. The CPU 31 receiving this signal starts various controls for the purpose of executing the zooming operation.

The CPU 31 first executes drive control of the zooming lens actuator 33 via the second driver 32 to cause movement of the zooming lens 22a with the zoom lever to the instructed extent of zooming in the instructed direction of zooming. That is, the second driver 33 applies a predetermined voltage across the zooming lens actuator 33. As a result, the zooming lens actuator 33 undergoes expansion in a predetermined direction to a predetermined extent. The zooming lens frame 22 holding the zooming lens 22a is thus moved, under the guide of the main and auxiliary guide bars 26 and 27, in a predetermined direction along the optical axis O2 and is stopped at a desired zooming position. To maintain the stationary state of the zooming lens 22a at this position, the second driver 32 continually applies voltage.

Concurrently with this zooming operation, the CPU 31 executes compensation control of the focus position such as to cause displacement of the focus adjusting lens 23a such as to provide for the maximum contrast of the foreground object image by analyzing the foreground object obtained by the imaging element 28c with control of the AF circuit 31a. That is, the CPU 31 executes drive control of the focus adjusting lens actuator 36 via the first driver 35 for always obtaining clear images displayed in the display unit 45.

At this time, the first driver 35 executes drive control for causing expansion of the focus adjusting lens actuator 36 in a predetermined direction by a predetermined extent by applying a predetermined voltage across the actuator 36. The focus adjusting lens frame 23 holding the focus adjusting lens 23a is thus moved, under the guide of the main and auxiliary guide bars 26 and 27, in a predetermined direction along the optical axis O2 in an interlocked relation to the zooming operation, and is stopped at a predetermined position, at which the focus state is obtained. To maintain this stationary position, the first driver 35 continually applies voltage.

After completion of the desired zooming operation in the above way, the user of the electronic camera 1 operates the release button 12 for executing the imaging operation. Specifically, the user executes the first state operation of the release button 12, thus generating an instruction signal instructing the execution of a predetermined imaging preparation operation. The instruction signal is fed to the CPU 31.

The CPU 31 receiving this signal starts various controls for executing a predetermined light intensity measuring operation and the focus adjusting operation. In the following description, only the focus adjusting operation will be described.

When the electronic camera 1 is in this state, the foreground object light flux is transmitted through the imaging optical system 20 to the imaging element 28c, thus forming an image of the foreground object on the light-receiving surface of the element 28c at a predetermined position thereof. At this time, the imaging element 28c performs photoelectric conversion of the foreground object imaged and feeds an electric signal obtained as a result via the imaging circuit 28d to the AF circuit 31a.

The AF circuit 31a analyzes the electric signal based on the received foreground object image. According to the result of the analysis, the CPU 31 executes drive control of the focus adjusting lens actuator 36 via the first driver 35. Specifically, the first driver 35 applies a predetermined voltage across the focus adjusting lens actuator 36. As a result, the focus adjusting lens actuator 36 undergoes strain in a predetermined direction to a predetermined extent.

With this strain, the focus adjusting lens frame 23 holding the focus adjusting lens 23a is moved, under the guide of the main and auxiliary guide bars 26 and 27, in a predetermined direction along the optical axis O2 to be stopped at a predetermined position corresponding to the state of focus. The stop position is maintained with continual voltage application to the first driver 35.

Subsequent to or concurrently with the focus adjusting operation, the CPU 31 controls a predetermined light intensity measuring means (not shown) to compute an exposure value suited for pick-up image containing the desired foreground object image and provisionally records the calculated exposure value data in a predetermined recording means In this way, the imaging preparation operation is completed.

Subsequently, the user operates the release button 12 as a second stage operation, thus generating a corresponding exposure instruction signal. Receiving this signal, the CPU 31 provides drive controls of the stop, the shutter and the imaging element 28c according to the computed exposure value. An exposure operation for obtaining a desired image is executed in this way.

Subsequently, the CPU 31 controls the imaging circuit 28d and the image processing circuit 42 to generate image data of the best form for recording in the recording medium 44, the generated data thus being recorded in the recording medium 44.

At the same time, the CPU 31 controls the image processing circuit 42 and the display unit 45, thus generating image data of the best form for displaying the image based on the obtained image signal and displaying the image data on the display screen of the display 45 for a predetermined time.

As has been described, in the above first embodiment, the electrostriction effect merely of polymer material is utilized to provide the drive means (i.e., the zooming and focus adjusting lens actuators 33 and 36) for driving an optical elements (i.e., the zooming and focus adjusting lenses 22a and 23a). Thus, it is possible to move the two lenses 22a and 23a in directions along the optical axis O2 with less power, thus contributing to power saving.

As for the drive means (33 and 36) of this drive system, the mechanical drive power transmitting mechanism can be simplified, thus contributing to noise reduction and also contributing to size reduction of the optical unit adopting these drive means.

The guide members (i.e., main and auxiliary guide bars 26 and 27) are provided such that they are parallel to the directions of movement of the optical elements (22a and 23a), i.e., directions along the optical axis O2, and the drive means (33 and 36) are disposed along and coaxially with one guide member (26). Thus, it is possible to increase the efficiency of the members and units and thus contribute to size reduction of the optical unit.

The drive means (33 and 36) are adapted to move the optical elements (33 and 36) by directly pushing the lens frames (22 and 23) holding the optical elements (22a and 23a) in the neighborhood of the fitting engagement of the lens frames (22 and 23) with the guide means (i.e., main guide bar 26). Thus, no power converting or power transmitting means has to be provided between the drive means (33 and 36) and the driven members (i.e., optical elements 22a and 23a). It is thus possible to suppress loss of drive power transmitted and also mechanical errors, thus permitting stable transfer of drive power and also contributing to improvement of the drive accuracy.

Furthermore, since the biasing means (i.e., biasing member 29) which biases the optical elements (22a and 23a) in directions opposite to the direction of driving of the optical elements (22a and 23a) by the drive means (33 and 36), the driven members (i.e., optical elements 22a and 23a) can always be positioned in a stable state.

Still further, the biasing means (i.e., biasing member 29) is formed by a spring member having a simple form (i.e, helical form) and is disposed at a position between adjacent ones of a plurality of optical elements (22a and 23s), it is possible to simplify the mechanism, thus contributing to reduction of the cost of manufacture.

Yet further, since a plurality of drive means (33 and 36) are disposed in correspondence to a plurality of driven means (i.e., optical elements 22a and 23a), respectively, no drive power transmitting mechanism or the like for driving a plurality of driven members with a single drive means is necessary, and it is thus possible to reduce complication of (i.e., simplify) the power transfer path, thus contributing to size reduction of the optical unit itself.

In the first embodiment as described above, in the optical unit which is constructed such that the zooming and focus adjusting lenses 22a and 23a can be moved independently, two actuators 33 and 36 of a system for generating drive power by utilizing the electrostriction effect are adopted as the drive means for independently moving the zooming and focus adjusting lens frames 22 and 23 for independently holding the two lenses 22a and 23a, respectively, in directions along the optical axis O2.

However, this example is by no means limitative. For example, while adopting an electrostriction actuator for driving the lens used for the zooming or focus adjusting operation, i.e., either zooming or focus adjusting lens 22a or 23a, a second drive means of a different drive system from that of the electrostriction actuator, for instance a conventionally utilized stepping motor or the like, may be adopted as drive means corresponding to lenses other than those driven by the electrostriction actuators.

In this case, it is thought to be a desirable selection to use electrostriction actuators for drive means for driving driven members (i.e., lenses) with relatively small extents of necessary movement, while adopting the second drive means (i.e., stepping motors or the like) as drive means for driving driven members (i.e., lenses) with relatively large extents of necessary movement.

This is so in that the following advantage is obtainable. For the large necessary movement extent case, high drive power can be obtained by using stepping motors or like drive means, while using, for the small necessary movement extent case, electrostriction actuators so as to be able to obtain necessary drive power with small drive power and suppress drive noise generated at the driving time.

In the imaging optical system 20 of the optical unit 2 applied to electronic camera 1 constructed such as in the first embodiment described above, the zooming lens 22*a* (i.e., zooming lens frame 22) is moved from a position of the shortest possible focus point (i.e., wide) side to a position of the longest possible focus point (i.e., tele) side. At this time, the extent of movement of the zooming lens 22*a* (i.e., zooming lens frame 22) is usually about 10 mm as noted above.

The focus adjusting lens 23*a* (i.e., focus adjusting lens frame 23) as described above, on the other hand, undergoes, for focus position compensation at the zooming time, a non-linear movement as shown in FIG. 19, from the shortest possible focus point side position to the longest possible focus point side. At this time, a distance of, for instance, at most 5 mm is covered. For focus adjustment, the lens 23*a* undergoes movement from close position on the nearest possible distance side to infinity (∞) position on the remotest possible distance side. At this time, the distance covered by the focus adjusting lens (i.e., the focus adjusting lens frame 23) is, for instance, about 1 mm. Desired action thus can usually be obtained with a very small extent of movement compared to the extent of movement of the lens at the time of the zooming operation.

It will be seen from the description above that a usual stepping motor or the like may be adopted as a drive means on the side of the zooming lens 23*a*, while adopting the electrostriction actuator 36 as described above as a drive means on the side of the focus adjusting lens 23*a*. An example of the above construction will now be described as a second embodiment of the present invention.

Figure 14:
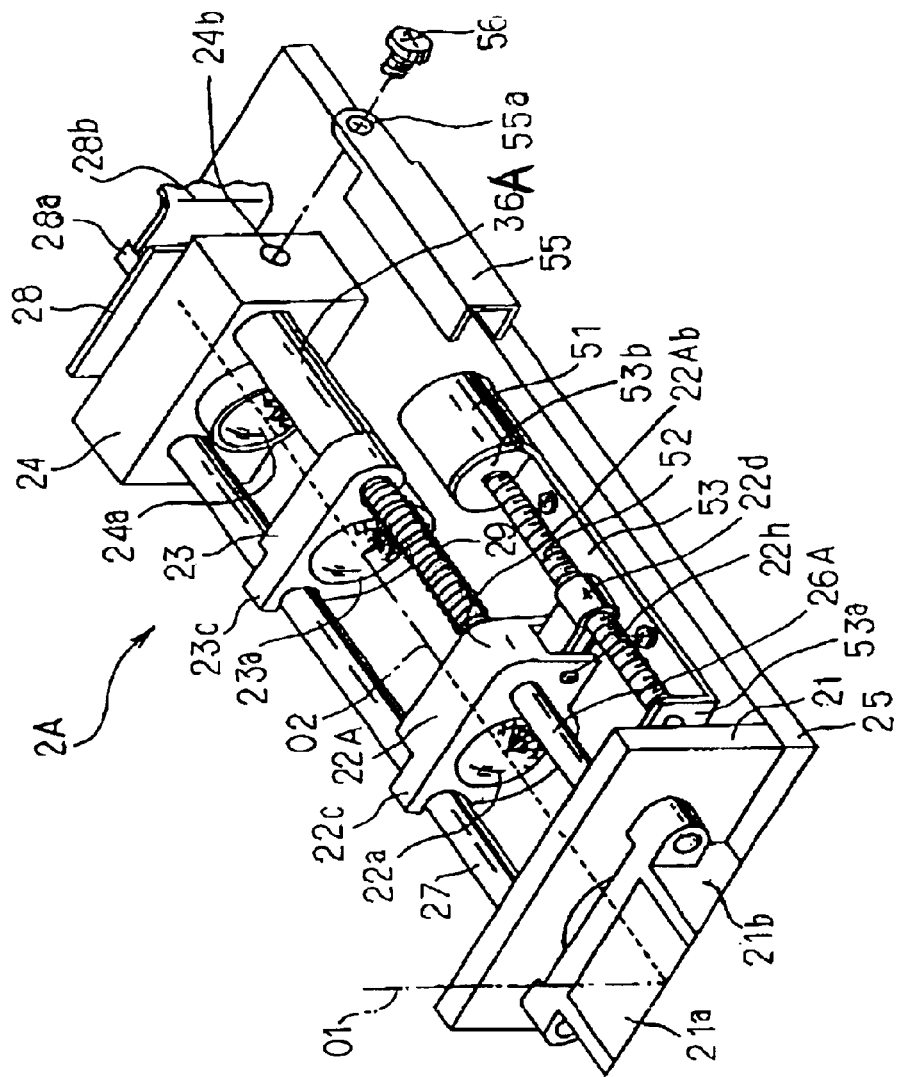
FIG. 14 is a perspective view showing a second embodiment of the optical unit according to the present invention.
Figure 15:
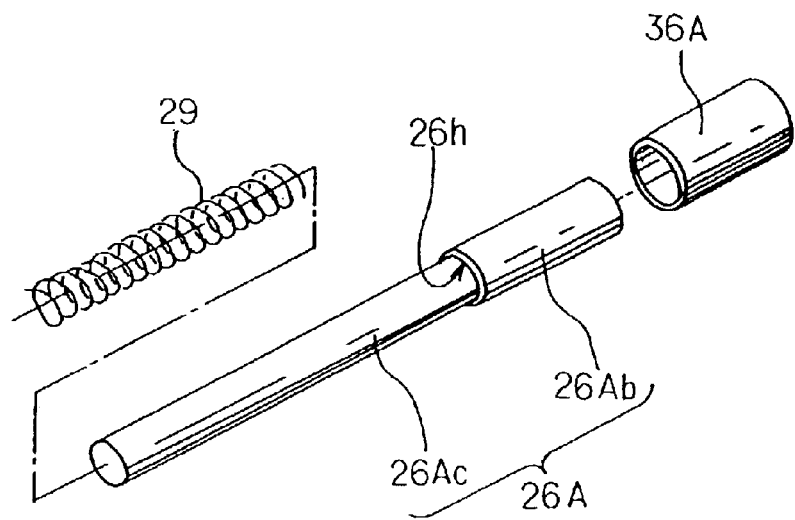
FIG. 15 is a fragmentary enlarged-scale exploded perspective view showing some constituting parts, i.e., guide means and drive means in the second embodiment of the optical unit of FIG. 14.
Figure 16:
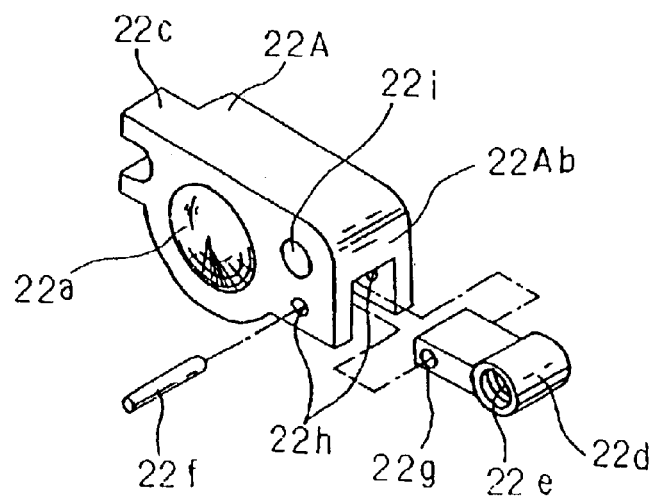
FIG. 16 is a fragmentary enlarged-scale perspective view showing only a zooming lens frame among the constituent parts of the second embodiment of the optical unit.

FIG. 14 is a perspective view showing a second embodiment of the optical unit (i.e., lens unit) according to the present invention. FIG. 15 is a fragmentary enlarged-scale exploded perspective view showing some constituting parts, i.e., guide means (i.e., main guide bar) and drive means (i.e., actuators) in the embodiment of the optical unit (i.e., lens unit). FIG. 16 is a fragmentary enlarged-scale perspective view showing only a zooming lens frame among the constituent parts of the embodiment of the optical unit (or lens unit).

The basic construction of lens unit 2A as a second embodiment of the optical unit is substantially the same as the first embodiment described above, and is different in the form of the drive means. Thus, in the following description only the structure different from that of the first embodiment will be described in detail, and like constituent parts are only designated by like reference numerals or symbols and are not described.

This embodiment of the optical unit (i.e., lens unit 2A) is also applied to the electronic camera shown in FIGS. 1 to 3.

In this embodiment of the lens unit 2A, a focus adjusting actuator 36A constituted by an electrostriction actuator is adopted as a drive means for driving the focus adjusting lens frame 23 holding the focus adjusting lens 23*a* as shown in FIG. 14, while adopting a stepping motor 51 as a second drive means of the different system from that of the above drive means for driving the zooming lens frame 22A holding the zooming lens 22*a*.

As shown in FIG. 15, the main guide bar 26A for guiding both the lens frames 22A and 23 in the movement thereof in directions along the optical axis O2, includes a large diameter part 26Ab, on which the focus adjusting lens actuator 36A is disposed in a state of winding in the outer periphery, and a small diameter part 26Ac, which supports a biasing member disposed on it in a state of winding on the outer periphery and also supports the zooming and focus adjusting lens frames 22A and 23 movably fitted on it.

The focus adjusting lens frame 23 is formed in the same manner as in the first embodiment, and the zooming lens frame 22A is formed as shown in FIGS. 14 and 16.

The zooming lens frame 22A has a through-hole 22*i* formed adjacent to one end 22Ab to be movably penetrated by the small diameter part 26Ac of the main guide bar 26, and in the neighborhood of end 22Ab, a coupling member 22*d* is provided as an integral member, which transfers rotational drive power from the stepping motor 51 to the zooming lens frame 22A to cause movement thereof in a direction along the optical axis O2.

The coupling member 22*d* has a through-hole 22*g* formed in the neighborhood of one end, and in correspondence to this hole the zooming lens frame 22A has a through-hole 22*h* formed adjacent to the end 22Ab. The zooming lens frame 22A and the coupling member 22*d* are made to be integral by a pin 22*f* fitted in the through-holes 22*h* and 22*g*.

The coupling member 22*d* has a substantially cylindrical end part having a threaded through-hole 22*e*, and a thread formed in the outer periphery of a shaft 52 of the stepping motor 51 is threadedly passed through the threaded hole 22*e*.

With the above construction, when the shaft 52 of the stepping motor 51 is rotated with driving thereof at a predetermined timing under control of the CPU 31, the rotational drive power is transferred via the threaded part of the shaft 52 and the threaded hole 22*e* of the coupling member 22*d* to the zooming lens frame 22A.

That is, the zooming lens frame 22A is interlocked to the rotational driving of the stepping motor 51 to be moved in a predetermined direction along the optical axis O2, i.e., a predetermined direction along the main guide bar 26A.

The stepping motor 51 is disposed by a securing member 53 at a predetermined position on top of the base 25. The securing member 53 is a thin plate-like member and has a motor support part 53*b*, which is provided at one end to secure one end face of stepping motor 51, and a shaft support part 53*a*, in which the shaft 52 is rotatably supported.

As described before, the focus adjusting lens actuator 36A is disposed on the large diameter part 26Ab of the main guide bar 26. The focus adjusting lens actuator 36A is substantially cylindrical in shape, and is disposed in a state that it is wound on the outer periphery of the large diameter part 25Ab.

A cover member 55 is disposed on the outer periphery of the focus adjusting lens actuator 36A. The cover member 55 is formed from a plate-like member having a substantially channel-like cross-sectional profile and has an end part secured to a side surface of the stationary lens frame 24. The cover member 55 is secured by such securing or coupling means as a screw. Specifically, as shown in FIG. 14, the cover member 55 has a hole 55*a*, and the corresponding side of the stationary lens frame 24 has a corresponding threaded hole 24*b*. The screw member 56 is secured to the side of the stationary lens frame 24 by inserting the screw 56 through the hole 55a of the cover member 55 and screwing the screw 56 into the threaded hole 24b.

The driving of the focus adjusting lens actuator 36A as the drive means for driving the focus adjusting lens 23a (i.e., focus adjusting lens frame 23) is controlled by the first driver 35 (see FIG. 3), while the driving of the stepping motor 51 as the second drive means for driving the zooming lens 22a (i.e., zooming lens frame 22) is controlled by the second driver 32 (see FIG. 3). For the remainder of the structure, this embodiment is entirely the same as the first embodiment described above, and it also has the same functions as in the first embodiment.

As described above, with the second embodiment it is possible to obtain the same effects as of the first embodiment described above.

Furthermore, this embodiment, while using the electrostriction actuator (i.e., focus adjusting lens actuator 36A) as drive means for driving the focus adjusting lens frame 23, is adapted to utilize an actuator of a different drive system (i.e., stepping motor 51) for a driven member (i.e., zooming lens frame 22) requiring a greater extent of movement.

As shown, as a plurality of drive means required for independently moving a plurality of lens frames, respectively, electrostriction actuators (i.e., drive means such as the focus adjusting lens actuator 36A) and actuators of a different drive system (i.e., second drive means such as the stepping motor 51 as the zooming actuator) are utilized and used in combination. Thus, it is possible to dispose the plurality of drive means to obtain the optimum application. It is thus possible to obtain efficient functions with an efficient member disposition and contribute to size reduction of the optical unit (i.e., lens unit) itself.

While the above embodiments of the optical units have been described in connection with electronic camera for obtaining and recording mainly still images, these embodiments are by no means limitative. Instead, the present invention is applicable to so-called film-type cameras using photographic imaging films, motion picture cameras and video cameras for obtaining electronic motion picture images as well as such optical devices as microscopes, binoculars and telescopes and such optical units as provided in optical pick-up devices such as optical recorders.

As has been described in the foregoing, according to the present invention the electrostriction effect of the electrostriction actuator is utilized in lieu of small-size motors or like actuators usually utilized in prior art cameras or the like. Thus, it is possible to provide an optical unit, which can contribute to simplification and size reduction of drive power transmitting mechanisms or the like and also contribute to power saving.

From the foregoing embodiments, the following structures and modifications thereof may also be listed with advantages:

(1) An optical unit comprising:
an optical element;
a guide means for guiding the optical element in movement in a predetermined direction; and
a drive means principally comprised of a polymer material for driving the optical element by utilizing the electrostriction effect.

Thus, with the optical unit according to the first aspect of the present invention, the optical elements can be driven with less drive power by using the drive means, which is mainly made of a polymer material and utilizes the electrostriction effect for driving the optical elements. Besides, the drive means of the drive system permits simplifying any mechanical drive power transmitting means, and thus can contribute to reduce noise and size.

(2) The optical unit according to the foregoing (1), wherein the polymer material is mainly such that it is strained by the electrostriction effect in a direction of movement of the optical element.

(3) The optical unit according to the foregoing (2), having electrode layers capable of undergoing strain in the same direction as the direction of strain of the polymer material on the surfaces of the polymer material.

(4) The optical unit according to the foregoing (3), wherein the electrode layers are formed such that an electric field is applied across the electrode layers in a direction perpendicular to the direction of strain of the drive means.

(5) The optical unit according to one of the foregoing (2) to (4), wherein the drive means is a lamination of a plurality of thin polymer material films.

(6) The optical unit according to one of the foregoing (2) to (5), wherein the polymer material is a member of the group consisting of silicone rubber, acrylic rubber or polyurethane.

(7) The optical unit according to one of the foregoing (3) and (4), which further comprises a drive control means for driving the optical element by applying a voltage across the electrode layers.

(8) The optical unit according to one of the foregoing (1) to (7), wherein the optical element is constituted by a lens, the drive means being capable of causing movement of the lens in a direction along the optical axis of the lens.

(9) The optical unit according to the foregoing (8), wherein the lens is used at least for the purpose of zooming operation or focus adjusting operation.

Thus, with the optical unit according to the ninth aspect (9) of the present invention set forth above, the zooming and focus adjusting operations can be executed with less power, thus contributing to the energy saving of the unit.

(10) The optical unit according to the foregoing (8), which further comprises a second drive means of a drive system different from that of the afore-said drive means for driving a lens other than the afore-said lens.

Thus, with the optical unit according to the tenth aspect (10) of the present invention a second drive means of a different drive system is utilized to cope with lenses requiring greater extents of movement. It is thus possible to cope with a broader field of applications by using a plurality of drive means suited for driving in combination.

(11) The optical unit according to the foregoing aspects (1) to (7), wherein the guide means is provided such that it extends parallel to the direction of movement of the optical element, the drive means being disposed along the guide means.

Thus, with the optical unit according to the eleventh aspect (11) of the present invention the drive means can be disposed co-axially with the guide means, thus contributing to size reduction of the optical unit itself.

(12) The optical unit according to the foregoing aspect (11), wherein the drive means is capable of driving the optical element by pushing the neighborhood of a part thereof in engagement with the guide means.

Thus, the optical unit according to the twelfth aspect (12) of the present invention neither any drive power converting means nor any drive power transmitting means need be provided between the drive means and the driven members, thus permitting stable drive power transfer and improvement of the drive accuracy.

(13) The optical unit according to the foregoing aspect (12), which further comprises a biasing means for biasing the optical element in a direction opposite to the direction of driving of the optical element by the drive means.

(14) The optical means according to the foregoing aspect (13), wherein the guide means is constituted by a straight bar-like member, the biasing means being a helical spring member formed such as to be wound on the bar-like member.

(15) The optical unit according to one of the foregoing aspects (11) to (13), wherein the guide means is constituted by a straight bar-like member, the drive means being provided in such a form that it is wound on the outer periphery of the bar-like member and having one end in contact with a stationary part and the other end disposed at a position at which it can push the optical element.

(16) The optical unit according to the foregoing aspect (15), wherein the drive means has a hollow cylindrical form capable of being fitted on the bar-like member.

(17) The optical unit according to one of the foregoing aspects (11) to (16), wherein the optical element is constituted by a lens, the drive means being capable of causing movement of the lens in a direction along the optical axis of the lens.

(18) The optical unit according to the foregoing aspect (17), wherein the lens is used at least for the purpose of zooming operation or focus adjusting operation.

(19) The optical unit according to one of the foregoing aspects (1) to (7), wherein the guide means guides a plurality of optical elements such that these optical elements can be moved independently, and the drive means is provided for each of the plurality of the optical elements along each of the guide member.

(20) The optical unit according to the foregoing aspect (19), wherein the drive means drives the optical elements by depressing the neighborhood of a part of the optical elements in engagement with the guide means.

(21) The optical unit according to one of the foregoing aspects (1) and (20), which further comprises a biasing means for biasing the plurality of optical elements in directions opposing the directions of movement of the optical elements.

Thus, with the optical unit according to the twenty-first aspect (21) of the present invention as a biasing means like that in the above thirteenth aspect (13) of the present invention, and it is thus possible to always position the driven members in a stable state.

(22) The optical unit according to the foregoing aspect (19), wherein the guide means is constituted by a straight bar-like member, the biasing means being made of helical spring members provided in a state of being wound on the bar-like member and disposed at positions between adjacent ones of the optical elements.

Thus, with the optical unit according to the twenty-second aspect (22) of the present invention, like the above fourteenth aspect (14) of the present invention, the biasing member can be formed with a spring member having a simple form, thus contributing to reduction of the cost of manufacture.

(23) The optical unit according to the foregoing aspect (19), wherein the plurality of drive means are disposed such as to sandwich the plurality of optical elements.

(24) The optical unit according to one of the foregoing aspects (19) to (23), wherein the guide means is constituted by a straight bar-like member, the drive means being provided in a state of being wound on the outer periphery of the bar-like member and has one end in contact with a stationary part and the other end disposed at a position to be able to push the optical element.

(25) The optical unit according to the foregoing aspect (23), wherein the drive means is a hollow cylindrical member capable of being fitted on the bar-like member.

(26) The optical unit according to the foregoing aspect (17), wherein the lens is used at least for the purpose of zooming operation or focus adjusting operation, the drive means being capable of causing movement of the plurality of lenses in directions along the optical axis of the lenses.

Thus, with the optical unit according to the twenty-sixth aspect (26) of the present invention, like the above ninth (9) or eighteenth (18) aspect of the present invention, the zooming or focus adjusting operation can be executed with less power, thus contributing to energy saving of the unit.

(27) The optical unit according to one of the foregoing aspects (1) to (26), which is used for an imaging optical system of a camera.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. An optical unit comprising:
   at least one lens support member for holding a lens and capable of being driven for displacement in unison with the lens for desired optical adjustment;
   a stationary guide bar for restricting the lens support member such that the displaceable direction thereof is along a predetermined direction; and
   at least one actuator element including at least one electrostriction element of a polymer material layer laminate disposed along and being wound on part of an outer periphery of the guide bar for generating a drive displacement due to expansion or compression in the longitudinal direction of the guide bar in response to a drive voltage applied across the element, the drive displacement being transferred to the lens support member along the stationary guide bar.

2. The optical unit according to claim 1, wherein each electrostriction element in each actuator element is substantially hollow and annular in form and has a release part formed on part of an outer periphery of the electrostriction element and along the axial direction.

3. The optical unit according to claim 1, wherein each actuator element further includes a biasing element for providing a prestrain to the electrorestriction element to impart a strain thereof in a curved circumferential direction.

4. The optical unit according to claim 3, wherein the biasing element is an elastic member for providing a stress in the curved plate-like electrostriction element in a direction of causing expansion of the electrostriction element by generating a biasing force in a direction so that the biasing element undergoes constant compression.

5. The optical unit according to claim 4, wherein the elastic member is a curved plate-like spring, which is saw-wave like in form and extends in the axial direction perpendicular to a direction of action of bias force provided by the curved plate-like spring.

6. The optical unit according to claim 1, wherein the electrostriction element of the actuator element is substantially cylindrical and has a release part formed on part of an outer periphery of the electrorestriction element and extending in the axial direction, the release part further including a biasing element for providing a pre-strain for causing expansion of the electrostriction element in the curved circumferential direction.

7. The optical unit according to claim 6, further comprising a cover member placed about an outer periphery of the biasing element.

8. The optical element according to claim 1, further comprising a cover member placed about an outer periphery of the electrostriction element.

9. The optical unit according to claim 1, wherein the electrostriction element has one axial end in constant contact with a stationary part and, when it undergoes strain or expansion displacement as a result of application of a drive voltage across it, its other end is brought into contact with a corresponding lens support member to push and cause displacement of the lens support member.

10. The optical unit according to claim 1, wherein the actuator element is constituted by a plurality of actuators each provided for a corresponding one of lens support members.

11. The optical unit according to claim 10, wherein a spring member wound about said stationary guide bar provides a biasing force for two of said lens support members for constantly urging said two lens support members into engagement with the actuators associated with and driving said two lens support members.

12. The optical unit according to claim 10, wherein said actuators drive their associated lens support members over different distances along said guide bar.

13. The optical unit according to claim 12 wherein said different distances are five (5) mm and one (1) mm, respectively.

14. The optical unit according to claim 12, wherein said two (2) lens support members respectively support a zooming lens and focusing lens and said actuator drives the zooming lens over a greater distance than the actuator driving said focusing lens.

15. The optical unit according to claim 12, wherein the actuator driving its associated lens support member over a greater distance than the remaining actuator is a non-electrostriction actuator.

16. The optical unit according to claim 1, wherein a second lens support member is driven by an actuator element which is not an electrorestriction element.

17. The optical unit according to claim 16, wherein second lens support element is slidably mounted upon said stationary guide bar.

18. The optical unit according to claim 1, wherein said polymer layer laminate is continuously wound about said stationary guide bar and comprises multiple layers of polymer film having an electrode on one surface of said film.

19. The optical unit according to claim 18, wherein alternate electrodes are coupled to a positive voltage and remaining intervening electrodes are coupled to a ground potential.

20. The optical unit according to claim 1, wherein said polymer layer laminate is provided with a gap to form discrete layers.

21. The optical unit according to claim 20 wherein each discrete layer is comprised of a polymer film having an electrode on one surface thereof.

22. The optical unit according to claim 1, wherein said laminate is provided with a gap to define discrete layers of polymer film each having an electrode on one surface thereof;

each layer having a cylindrical shape, free ends of each layer being circumferentially spaced from one another; and means for retaining said layer in said cylindrical shape.

23. The optical unit according to claim 22, wherein said means for retaining comprises a saw-wave shaped elastic member.

24. The optical unit according to claim 1, wherein said laminate is comprised of the order of forty (40) layers of polymer film and having an electrode on one surface thereof.

25. The optical unit according to claim 1, wherein each layer has a thickness of the order of 0.78 um, including said electrode.

* * * * *